(12) United States Patent
Bauchot et al.

(10) Patent No.: US 10,617,039 B2
(45) Date of Patent: *Apr. 7, 2020

(54) VARIABLE AIR COOLING SYSTEM FOR DATA CENTERS

(71) Applicant: International Business Machines Corporation, Armonk, NY (US)

(72) Inventors: Frederic Bauchot, Saint-Jeannet (FR); Jean-Yves Clement, Saint-Jeannet (FR); Jean-Marc Legrand, Cagner sur Mer (FR); Francois-Rene Rougeaux, Castelnau le Lez (FR)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/034,503

(22) Filed: Jul. 13, 2018

(65) Prior Publication Data
US 2018/0332738 A1 Nov. 15, 2018

Related U.S. Application Data

(63) Continuation of application No. 14/600,056, filed on Jan. 20, 2015, now Pat. No. 10,091,912.

(30) Foreign Application Priority Data

Jan. 21, 2014 (GB) .................................. 1400979.9

(51) Int. Cl.
*G05D 23/00* (2006.01)
*H05K 7/20* (2006.01)
(Continued)

(52) U.S. Cl.
CPC .......... *H05K 7/20745* (2013.01); *F24F 11/30* (2018.01); *F24F 11/62* (2018.01);
(Continued)

(58) Field of Classification Search
CPC .............. F28D 1/0471; H05K 7/20836; H05K 7/20718; H05K 7/20745; F24F 11/30;
(Continued)

(56) References Cited

U.S. PATENT DOCUMENTS

| 7,259,963 B2 | 8/2007 | Germagian et al. |
| 8,320,125 B1 | 11/2012 | Hamburgen et al. |

(Continued)

FOREIGN PATENT DOCUMENTS

EP 2397785 12/2011

OTHER PUBLICATIONS

STULZ, Integrated into a STULZ Modular Container Solution, 2013, Source: http://www.stulz-ats.com, 3 pages.
(Continued)

*Primary Examiner* — Tuan A Vu
(74) *Attorney, Agent, or Firm* — Schmeiser, Olsen & Watts, LLP; Mark Vallone

(57) ABSTRACT

A method and system for cooling air within an enclosure. The enclosure includes a cooling system and a remaining portion of the enclosure that is external to the cooling system. An outside air temperature of air entering the cooling system from outside the enclosure is monitored. A blowing air temperature of air in the cooling system at the outlet of the cooling system is monitored. A first inlet of the enclosure is controlled to be fully open or fully closed, in dependence on the monitored outside air temperature. A second inlet of the enclosure is controlled by adjusting an amount of opening of the second inlet, in dependence on the monitored blowing air temperature. A valve in a secondary water circuit of the cooling mechanism is controlled by adjusting an amount of opening of the valve, in dependence on the monitored outside air temperature.

18 Claims, 17 Drawing Sheets

(51) Int. Cl.
*F24F 11/30* (2018.01)
*F24F 11/62* (2018.01)
*F24F 11/63* (2018.01)
*F24F 11/46* (2018.01)
*F24F 11/70* (2018.01)

(52) U.S. Cl.
CPC ............... *F24F 11/46* (2018.01); *F24F 11/63* (2018.01); *F24F 11/70* (2018.01)

(58) Field of Classification Search
CPC .. F24F 11/62; F24F 11/63; F24F 11/46; F24F 11/70
See application file for complete search history.

(56) References Cited

U.S. PATENT DOCUMENTS

| | | |
|---|---|---|
| 2004/0223300 A1 | 11/2004 | Fink et al. |
| 2006/0139877 A1* | 6/2006 | Germagian ........ H05K 7/20745 361/695 |
| 2008/0245083 A1 | 10/2008 | Tutunoglu et al. |
| 2009/0210096 A1* | 8/2009 | Stack ....................... F24F 11/30 700/278 |
| 2010/0067193 A1 | 3/2010 | Arimilli et al. |
| 2010/0263830 A1 | 10/2010 | Noteboom et al. |
| 2011/0195652 A1* | 8/2011 | Smith ................ H05K 7/20836 454/184 |
| 2011/0290448 A1* | 12/2011 | Campbell ............. F28D 1/0471 165/104.13 |
| 2012/0298334 A1 | 11/2012 | Madaffari et al. |
| 2012/0300391 A1 | 11/2012 | Keisling et al. |
| 2013/0021746 A1 | 1/2013 | Campbell et al. |
| 2013/0133350 A1* | 5/2013 | Reytblat ............ H05K 7/20718 62/259.2 |
| 2015/0208553 A1 | 7/2015 | Bauchot et al. |

OTHER PUBLICATIONS

Paolo Bertoldi, Institute for Energy and Transport, European Code of Conduct for Data Centre, 2013, Source: http://iet.jrc.ec.europa.eu/, 16 pages.
Office Action (dated Sep. 5, 2017) for U.S. Appl. No. 14/600,056, filed Jan. 20, 2015.
Amendment (dated Dec. 1, 2017) for U.S. Appl. No. 14/600,056, filed Jan. 20, 2015.
Final Office Action (dated Feb. 4, 2018) for U.S. Appl. No. 14/600,056, filed Jan. 20, 2015.
Final amendment (dated Apr. 16, 2018) for U.S. Appl. No. 14/600,056, filed Jan. 20, 2015.
Notice of Allowance (dated May 22, 2018) for U.S. Appl. No. 14/600,056, filed Jan. 20, 2015.
312 amendment (dated Jul. 3, 2018) for U.S. Appl. No. 14/600,056, filed Jan. 20, 2015.

* cited by examiner

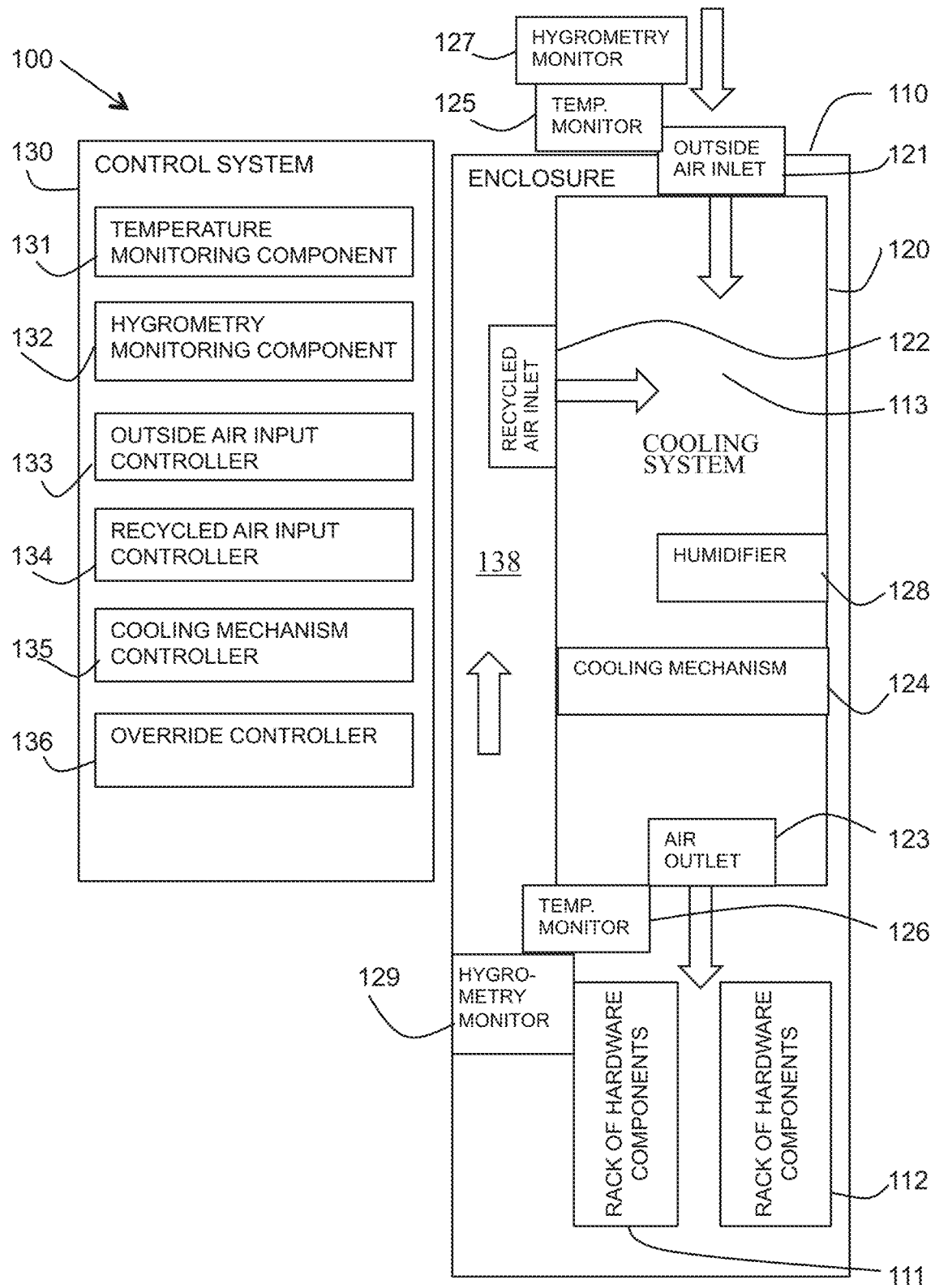

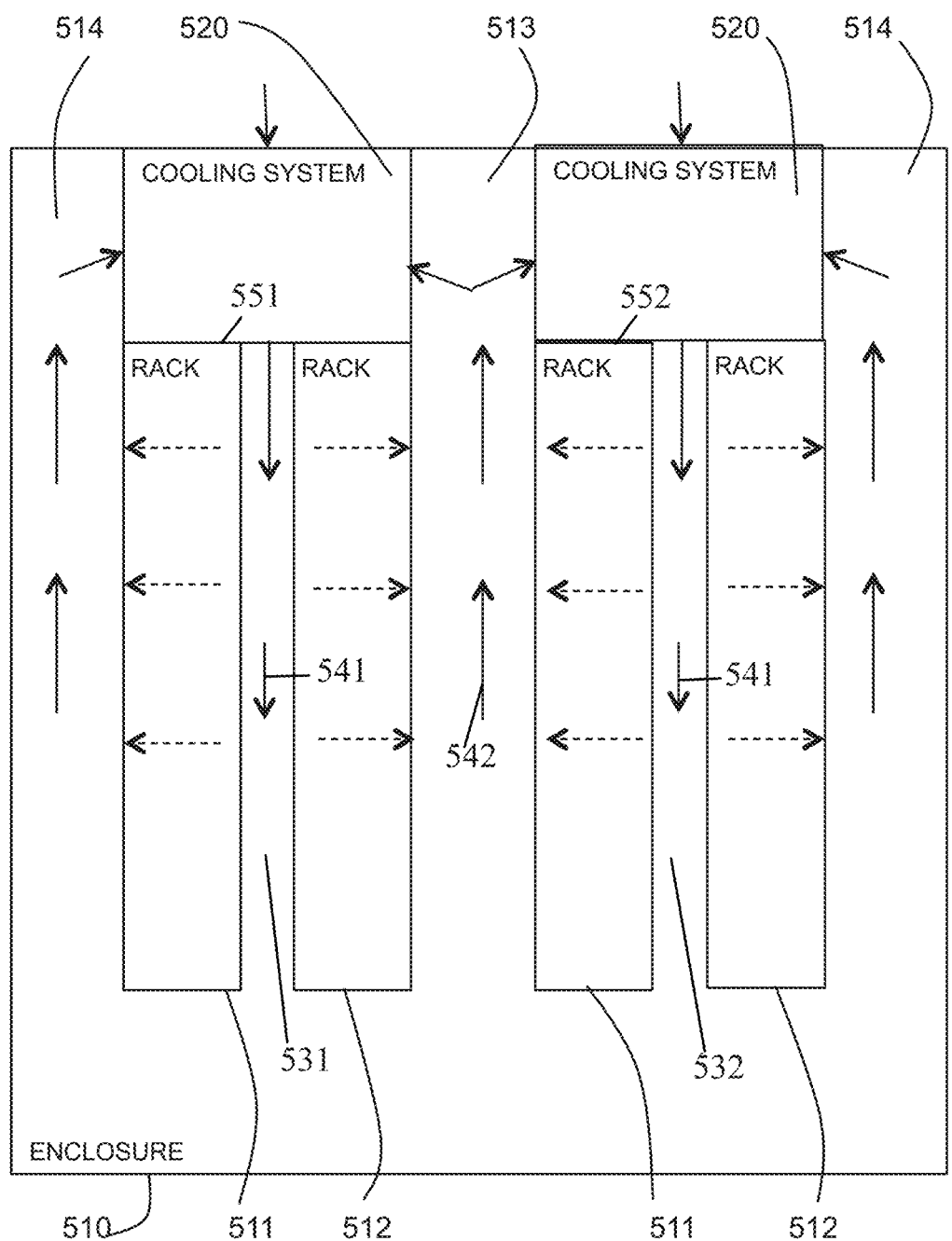

VARIABLE AIR COOLING SYSTEM FOR DATA CENTERS

This application is a continuation application claiming priority to Ser. No. 14/600,056, filed Jan. 20, 2015, now U.S. Pat. No. 10,091,912, issued Oct. 2, 2018.

TECHNICAL FIELD

The present invention relates to the field of cooling system for data centers and in particular, the invention relates to a variable air cooling system for high density data centers.

BACKGROUND

Rack frame mounting systems for hardware components are used in a large number of environments in which multiple hardware components are stacked either vertically or horizontally in an enclosure. Rack frame mounting systems are commonly used in data centers to house computer hardware in dense hardware configurations. For example, the computer hardware may be in the form of servers, storage units, etc. Rack frame mounting systems are also used for hardware systems other than computing systems such as telecommunications, audio, video, entertainment, etc.

Densely configured hardware components, in particular, computer servers and other large high-performance computer systems, generate a large amount of heat when operating which requires cooling. In some situations, the room in which the hardware components are situated may be cooled.

Under floor air systems are known which require a raised floor and integral planning. Air flow may be disturbed in under floor systems due to cables and other components being placed in the under floor space.

Known cooling systems for high density data centers may use cooling doors or containers. For example, active rear door rack cooling systems are known. However, the energy efficiency is not good due to the inability to have direct free cooling and the lack of compatibility with existing low density areas.

Free cooling systems for low density data centers allow fresh air from outside to circulate. In classic systems, cooling doors are not used and this provides good energy efficiency provided there is not too much heat to evacuate. A computer room air conditioner (CRAC) is used for the whole room consisting of a heat exchanger and a fan to cool the air.

Even in the standard free cooling systems, controlling the outside air temperature and hygrometry (T&H), the blowing T&H, starting of free cooling, and air mixing unit settings is always a complicate problem. It requires several control loops interfering each other.

Therefore, there is a need in the art to address the aforementioned problems.

BRIEF SUMMARY

According to a first aspect of the present invention there is provided a system o variable air cooling for data centers, comprising: an enclosure to be cooled suitable for housing hardware components; a cooling system including: a first air input for controllably allowing input of outside air from outside the enclosure; a second air input for controllably allowing input of recycled air from the enclosure; a selectively activatable cooling mechanism; an air output for allowing output of air into the enclosure; a first temperature monitor for monitoring an outside air temperature of air outside the enclosure; a second temperature monitor for monitoring a blowing air temperature of air at the air output; and a control system for controlling an operation of the first air input, the second air input, and the cooling mechanism dependent on a monitored outside air temperature at the first temperature monitor and a monitored blowing air temperature at the second temperature monitor.

The cooling system ay output air with a variable temperature in a predefined temperature range to optimize hygrometry control.

In one embodiment, the cooling system may be a room cooling system and the enclosure is a room containing multiple racks suitable for housing hardware components.

In another embodiment, the cooling system may be a modular cooling system for a pair of parallel racks suitable for housing hardware components, wherein the air output of the cooling system is arranged to provide cooling air to an aisle between the pair of parallel racks. The system may include multiple air outlets disposed adjacent multiple fans and multiple cooling mechanisms and extending in an elongate arrangement on top of a rack suitable for housing hardware components. The system may include a fan at the air output controlled by an air pressure in the aisle between the pair of parallel racks. Multiple cooling systems may be arranged in adjacent configuration and may include a common air return path to share cooling from the multiple cooling systems.

The cooling mechanism may be a heat exchanger controlled by input of cooling water. The cooling mechanism may include a secondary water circuit with a valve to adapt the water temperature of the heat exchanger to avoid condensation. The secondary water circuit may include a variable speed pump controlled with returning water temperature.

The cooling system may include a humidifier for selectively controlling the hygrometry of the air in the cooling system.

The control system may include an override control for detecting exceptional conditions outside the enclosure.

The cooling system may include a hygrometer outside the enclosure for determining a maximum water weight in outside air and wherein the control system is also dependent on the hygrometer measurement.

According to a second aspect of the present invention there is provided a method for variable air cooling for data centers carried out at a cooling system for cooling an enclosure, comprising: monitoring an outside air temperature of air outside the enclosure; monitoring a blowing air temperature of air at an air output of the cooling system; and controlling the operation of a first air input to the cooling system for controllably allowing input of outside air from outside the enclosure; controlling the operation of a second air input to the cooling system for controllably allowing input of recycled air from the enclosure; controlling a selectively activatable cooling mechanism in the cooling system; wherein the three controlling steps are carried out dependent on a monitored outside air temperature and a monitored blowing air temperature.

Monitoring an outside air temperature of air outside the enclosure may determine if the outside air temperature rises above a predefined maximum value. The predefined maximum value may be a mean temperature of air exiting one or more hardware components of a data center.

Monitoring a blowing air temperature of air at an air output of the cooling system may determine if the blowing air temperature is maintained in a predefined temperature range.

Controlling the operation of a first air input to the cooling system for controllably allowing input of outside air from outside the enclosure may include: determining if the outside air temperature rises above the predefined maximum value; and closing the first air input if the predefined maximum value is exceeded. The method may include opening the second air input if the first air input is closed.

Controlling the operation of a second air input to the cooling system for controllably allowing input of recycled air from the enclosure may include: determining if the blowing air temperature is below a lower temperature limit of the predefined temperature range; controllably opening the second air inlet if the blowing air temperature is below the lower temperature limit.

Controlling a selectively activatable cooling mechanism in the cooling system may include: determining if the blowing air temperature is above a higher temperature limit of the predefined temperature range; and controllably operating the cooling mechanism if the blowing air temperature is above the higher temperature limit.

According to a third aspect of the present invention there is provided a computer program product variable air cooling for high density data centers, the computer program product comprising: a computer readable storage medium readable by a processing circuit and storing instructions for execution by the processing circuit for performing a method according to the second aspect of the present invention.

According to a fourth aspect of the present invention there is provided a computer program stored on a computer readable medium and loadable into the internal memory of a digital computer, comprising software code portions, when said program is run on a computer, for performing the method of the second aspect of the present invention According to a fifth aspect of the present invention there is provided a modular system for variable air cooling for data centers, comprising: an enclosure to be cooled suitable for housing hardware components; a modular cooling system having a housing including: a first air input for controllably allowing input of outside air from outside the enclosure into the housing; a second air input for controllably allowing input of recycled air from the enclosure into the housing; a selectively activatable cooling mechanism provided in the housing; an elongate duct having one or more air outputs for allowing output of air from above one or more racks housing hardware components.

The modular system may include: a first temperature monitor for monitoring an outside air temperature of air outside the enclosure; a second temperature monitor for monitoring a blowing air temperature of air at the air output; and a control system for controlling an operation of the first air input, the second air input, and the cooling mechanism dependent on a monitored outside air temperature at the first temperature monitor and a monitored blowing air temperature at the second temperature monitor.

The described aspects of the invention provide the advantage of providing direct air free cooling with energy efficiency for high density and low density environments. Modularity of the system allows for reconfiguration and avoids infrastructure investment.

BRIEF DESCRIPTION OF THE DRAWINGS

The subject matter regarded as the invention is particularly pointed out and distinctly claimed in the concluding portion of the specification. The invention, both as to organization and method of operation, together with objects, features, and advantages thereof, may best be understood by reference to the following detailed description when read with the accompanying drawings.

Preferred embodiments of the present invention will now be described, by way of example only, with reference to the following drawings.

FIG. 1 is a schematic diagram of a system in accordance with an aspect of the present invention.

DETAILED DESCRIPTION

Figure 2A:
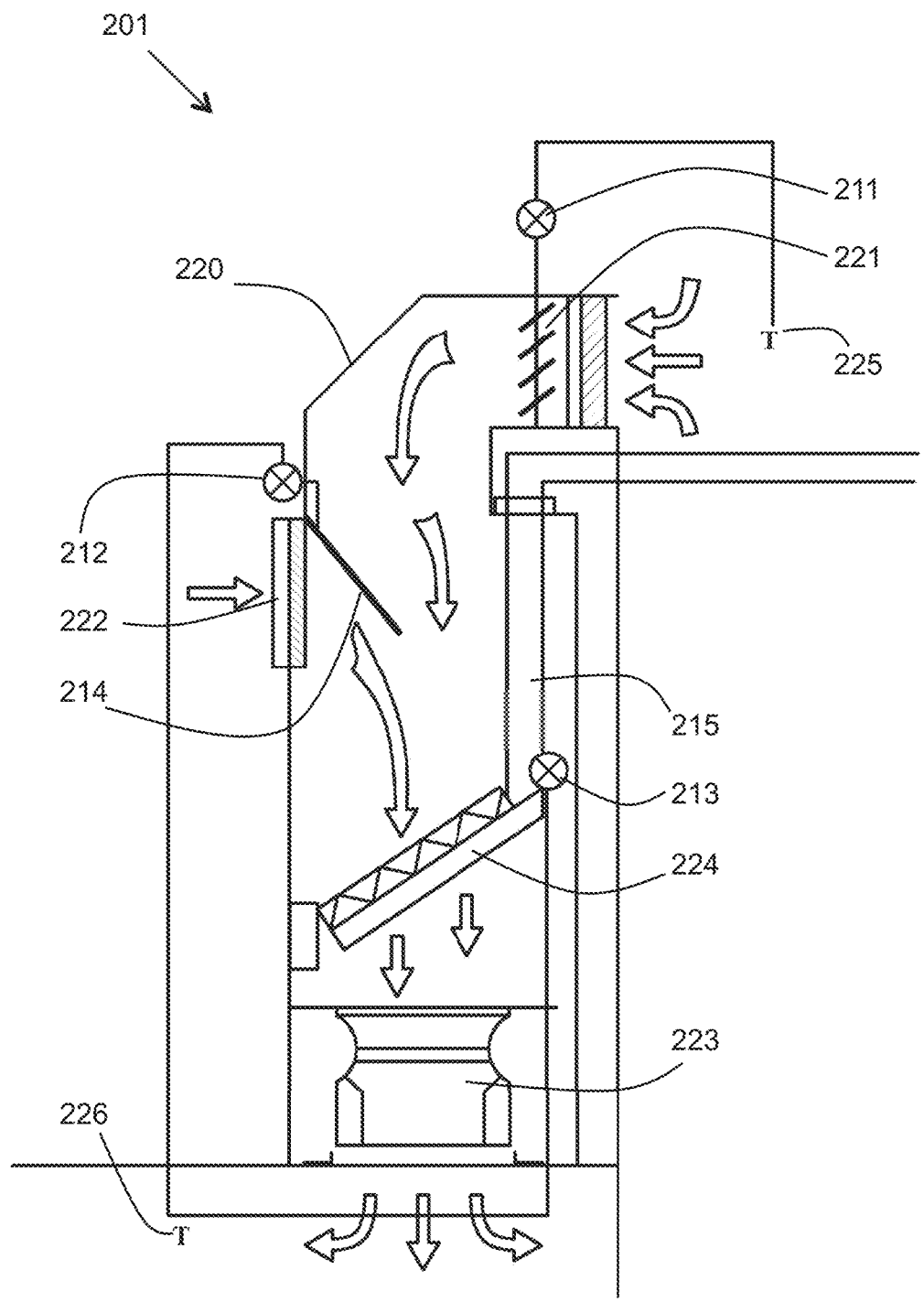
FIGS. 2A to 2D are schematic diagrams of a first embodiment a system in accordance with an aspect of the present invention shown in four different positions.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numbers may be repeated among the figures to indicate corresponding or analogous features.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

A variable air cooling system is described suitable for high density data centers. The variable air cooling system is provided for an enclosure and two embodiments are described herein of different enclosures. In a first embodiment, the enclosure is a data center room and the air cooling system cools the entire room or a section of it. In a second embodiment, a modular system is described and the enclosure is a pair of racks provided in two parallel rows with a cold air aisle between them. In an extension of the second embodiment, the modular system may include an enclosure with two or more pairs of racks.

Referring to FIG. 1, a system 100 is shown with an enclosure 110 for housing racks of hardware components 111, 112. In a first embodiment, the enclosure 110 may be a room of a data center with multiple racks 111, 112 provided, for example in parallel rows (in FIG. 1 only two racks 111, 112 are shown for illustration). In a second embodiment, the enclosure 110 may be a room or a partition within a room with a modular system of one or more pairs of racks 111, 112 having a dedicated cooling system.

The system 100 may include a cooling system 120 within the enclosure 110. The enclosure 110 includes the cooling system 120 and a remaining portion 138 of the enclosure 110 that is external to the cooling system 120. The cooling system 120 may include an outside air inlet 121 for controllably allowing air to enter the cooling system 120 from outside the enclosure 110. The outside air inlet 121 may be fed by a duct from outside air terminating in a plenum at which a shutter, one-way vent, or other form of controllable inlet may be provided.

The outside air inlet 121 allows a controlled amount of free cooling to the enclosure 110. As the enclosure 110 houses heat generating hardware components, the air temperature in the enclosure 110 is generally higher than the air outside the enclosure 110. The cooling system 120 may also include a recycled air inlet 122 for controllably allowing air from within the enclosure 110 to be input into the cooling system 120. The recycled air inlet 122 may also be in the form of a shutter, one-way vent, or other form of controllable inlet. The cooling system 120 may include a volume 113 at which the outside air and the recycled air input to the cooling system 120 are mixed.

The cooling system 120 may also include a cooling mechanism 124 such as a heat exchanger, cooling radiator, cooling coil, or other mechanism for cooling the air in the cooling system 120. The cooling mechanism 124 may include a secondary water circuit with a valve to adapt the water temperature of the heat exchanger to avoid condensation. The secondary water circuit may include a variable speed pump controlled with returning water temperature.

Cooling mechanisms 124 in the form of cooling coils have a good efficiency if the delta temperature is between 8° C. to 10° C. For example, if air is blown at 25° C. and chilled water is at 15° C. If the chilled water temperature is too low (for example, 10° C.) the air is condensating on the coil and efficiency is lost resulting in a need to humidify again and again. In the case of a chilled water low temperature, the described system may include a water loop mixing with a small pump the chilled water with the water going out from the coil to inject it in the coil with the desired temperature.

The cooling mechanism 124 may include a fan for drawing the air flow through the cooling system towards the cooling mechanism 124 and then towards an air outlet 123 for blowing air out of the cooling system 120 into the enclosure 110. One or more air outlets 123 may be provided. In one embodiment, this may be provided to an under floor system. In an alternative embodiment this may be provided to individual or pairs of racks in a modular system and may be provided from outlets along the top of the racks.

In addition, the cooling system 120 may include two temperature monitors 125, 126. A first temperature monitor 125 may be provided external to the enclosure 110 adjacent the outside air inlet 121 to measure the outside air temperature of the air outside the enclosure 110. A second temperature monitor 126 may be provided external to the air outlet 123 of the cooling system 120 to monitor the blowing air temperature of the output air.

The cooling system 120 may also include a hygrometry monitor 127 for monitoring the air moisture content in the outside air. The outside hygrometry monitor 127 may determine if the outside air shutter 121 should be closed if the weight of water is too high to ensure a maximum relative hygrometry at blowing temperature.

A second hygrometry monitor 129 may be provided for monitoring the air moisture of the air in the enclosure 110 and a humidifier 128 may be provided for adjusting the air moisture content in the cooling system.

Other additional components may be provided as described further in the additional embodiments given below.

The system 100 may also include a control system 30 for controlling the operation of the cooling system 120, in particular the operation of the outside air inlet 121, the recycled air inlet 122, the cooling mechanism 124, and optionally the humidifier 128 based on the monitoring by the temperature monitors 125, 126 and optionally the hygrometry monitor 127.

The control system 130 may include a temperature monitoring component 131, a hygrometry monitoring component 132, an outside air inlet controller 133, a recycled air inlet controller 134, a cooling mechanism controller 135, and an override controller 136. The override controller 136 may be used if exceptional circumstances arise external to the enclosure in which case, the outside air inlet 121 may be closed.

The control system 130 selectively opens and closes the outside air inlet 121 and the recycled air inlet 122 and selectively operates the cooling mechanism 124 and optionally the humidifier 128 in order to control the air outlet temperature and hygrometry.

Referring to FIGS. 2A to 2D, a first embodiment of a cooling system is shown in four different temperature operations.

FIGS. 2A to 2D show a cooling system 220 with an outside air inlet 221 in the form of a outside air shutter with a controller engine 211 and an outside air temperature monitor 225. The cooling system 220 may also include a recycled air inlet 222 with a filter and a recycled air shutter 214 with a controller engine 212. The air shutter 214 in rotation controls the mixing between the air coming from the outside air inlet 221 and the recycled air coming from air inlet 222. The air outlet 223 may be in the form of a fan for sucking air through the cooling system 220 and blowing air out into the enclosure. A blowing air temperature monitor 226 may be provided adjacent the air outlet 223. The cooling system 220 may also include a cooling mechanism 224 in the form of a heat exchanger with a controller engine 213. The cooling mechanism 224 may be fed with cooling water through a pipe 215 and the controller engine 213 may control a valve in the cooling water pipe 215 utilizing the blowing air temperature monitor 226.

Referring to FIG. 2A, a first temperature range operation 201 of the cooling system 220 is shown which is used when the outside air temperature is monitored as being below a first temperature. This first temperature range operation 201 is referred to as "mixing control" and is for cool to cold temperatures, for example below approximately 13 degrees Celsius. In this operation, the outside air inlet 221 is in an open position allowing air to enter the cooling system 220 to provide free cooling. The cooling mechanism 224 is switched off and the recycled air inlet 222 is controlled with shutter 214 to allow a variable amount of air to be recycled. The amount of air allowed to be recycled will decrease as the outside air temperature rises.

Figure 2B:
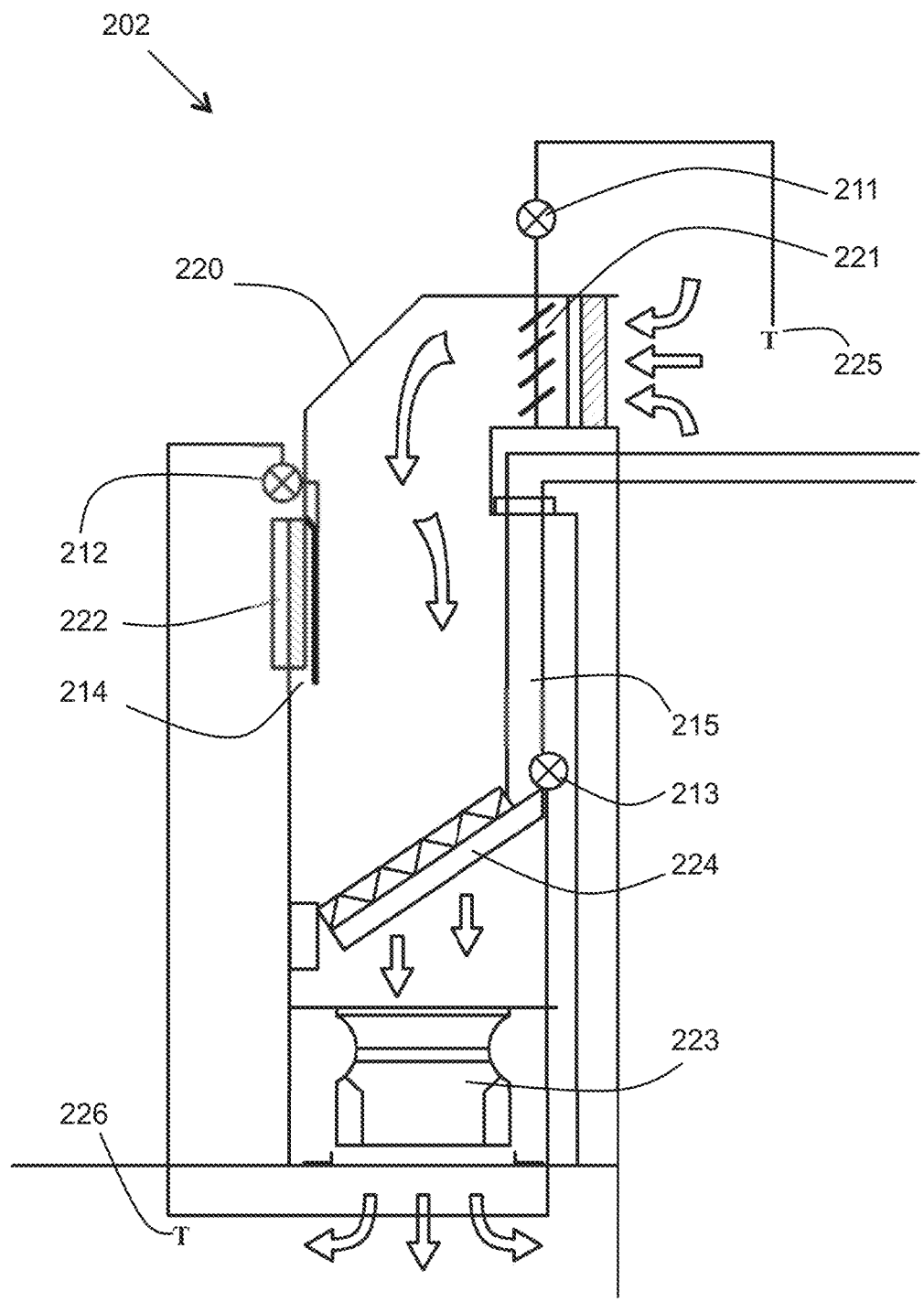

Referring to FIG. 2B, a second temperature range operation 202 of the cooling system 220 is shown which is used when the blowing air temperature at the air outlet is monitored as being at the first temperature which is the lower temperature in an acceptable range. The acceptable range for the blowing air temperature may be from 13 degrees Celsius to 25 degrees Celsius. The second temperature range operation 202 is referred to as "free running" and is for warm weather. In this operation, the outside air inlet 221 is in an open position allowing air to enter the cooling system 220 to provide free cooling. The cooling mechanism 224 is switched off and the recycled air inlet 222 is closed with shutter 214. This provides a solely free cooling operation.

Figure 2C:
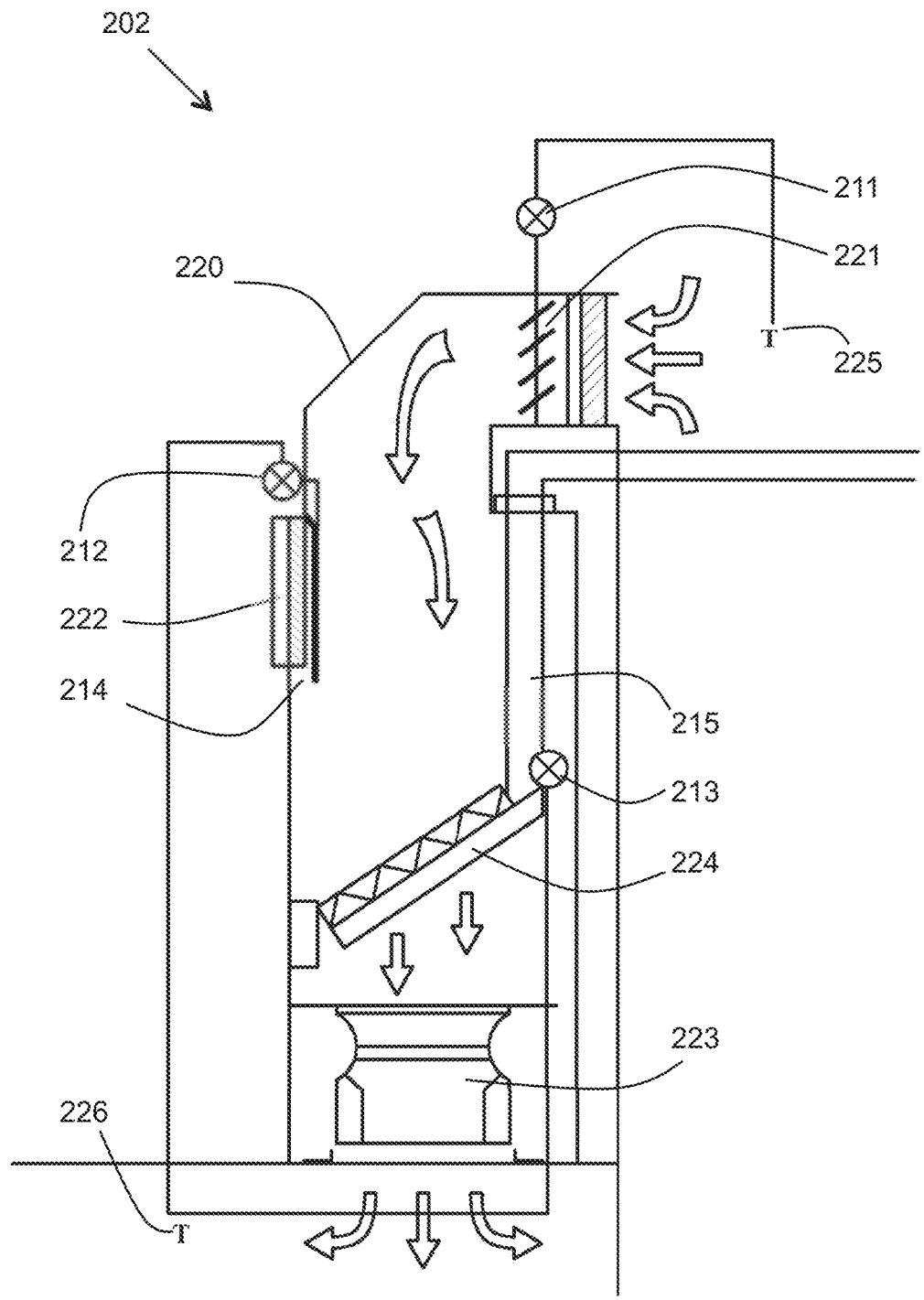

Referring to FIG. 2C, a third temperature range operation 203 of the cooling system 220 is shown which is used when the blowing air temperature at the air outlet is monitored as being at the second temperature which is the higher temperature in an acceptable range. The third temperature range operation 203 is referred to as "free cooling plus water" and is for hot weather. In this operation, the outside air inlet 221 is in an open position allowing air to enter the cooling system 220 to provide free cooling. The cooling mechanism 224 is switched on by a variable amount controlled with the blowing air temperature monitor 226 and the recycled air inlet 222 is closed with shutter 214.

Figure 2D:
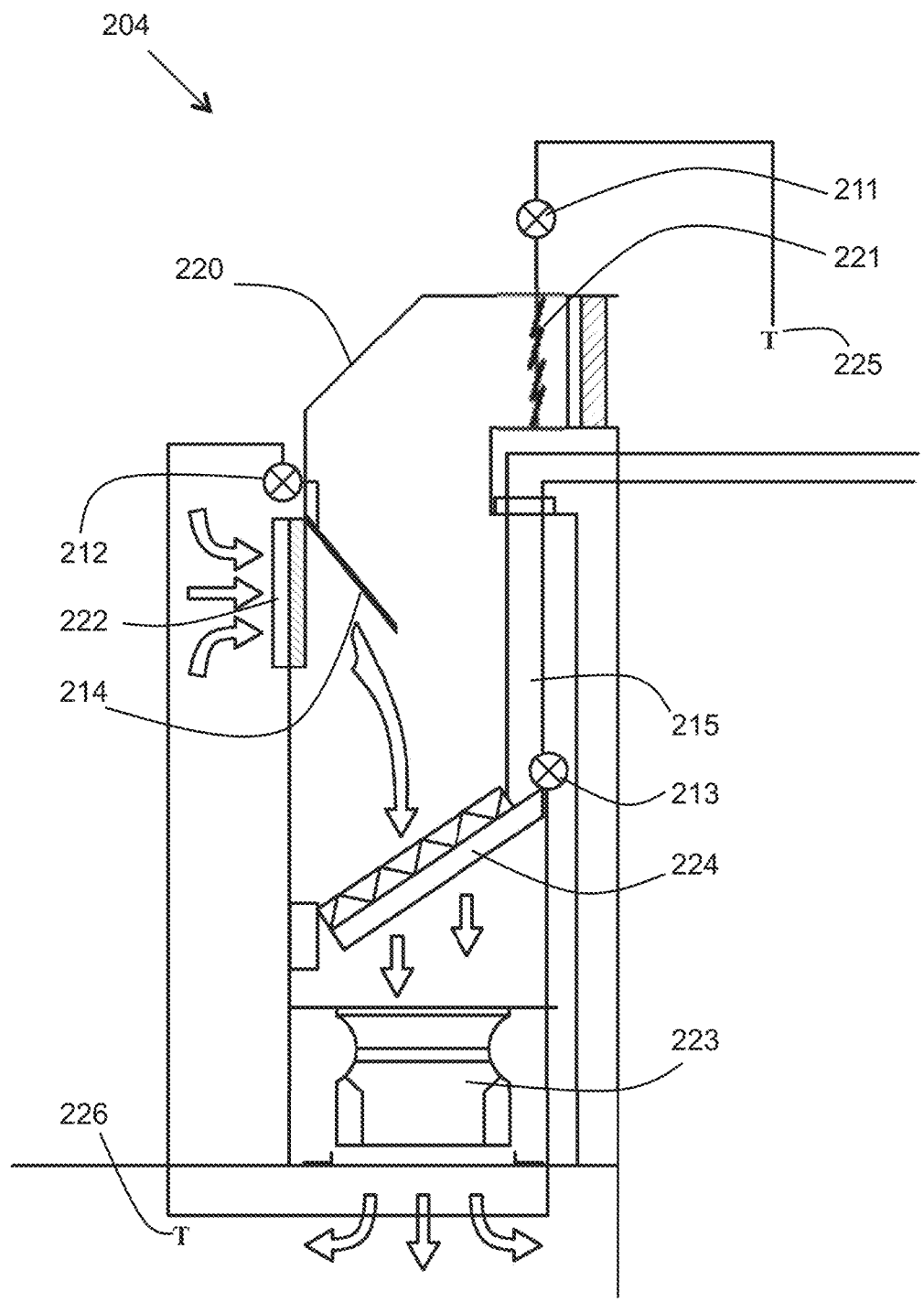

Referring to FIG. 2D, a fourth temperature range operation 204 of the cooling system 220 is shown which is used when the outside air temperature is monitored as being above the third temperature. The fourth temperature range operation 204 is referred to as "free cooling stopped" and is for heat wave weather where the outside air temperature is above approximately 35 degrees Celsius. In this operation, the outside air inlet 221 is in a closed position allowing no air to enter the cooling system 220. The cooling mechanism 224 is switched on by a full amount and the recycled air inlet 222 is fully open.

Figure 3:
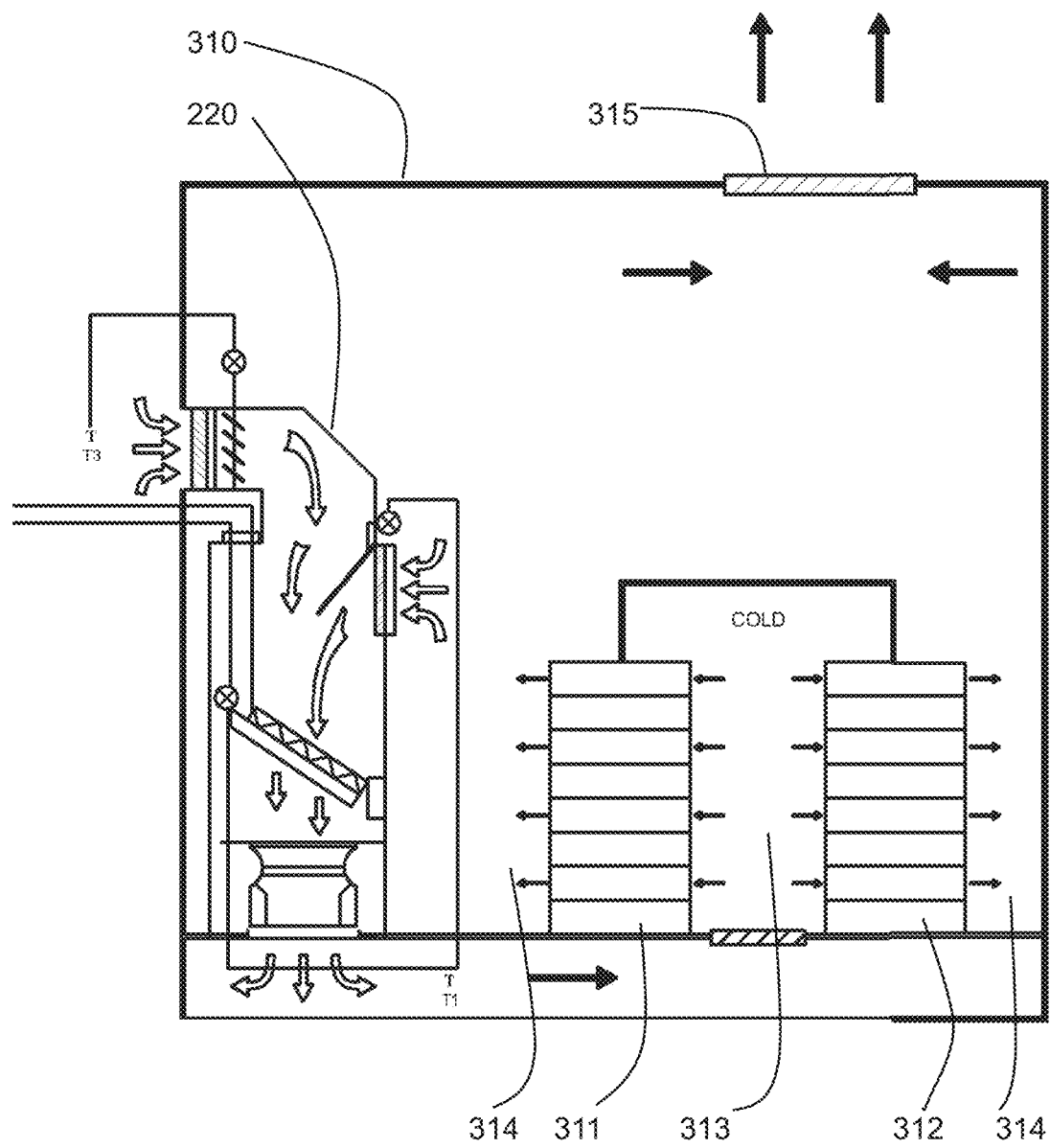
FIG. 3 is a schematic diagram of the first embodiment of the system in a room environment.

Referring to FIG. 3, the cooling system 220 of FIG. 2 is shown in an enclosure 310 in the form of a room containing racks 311, 312 of hardware components. The enclosure 310 may include an air vent 315 in a top surface for allowing hot air to escape from the enclosure. Cooled air from the cooling system 220 may be output below the racks 311, 312 and may be directed between racks 311, 312 in a cold aisle. Aisles between racks 311, 312 may alternate between cold aisles where air is sucked into hardware components to cool them and hot aisles into which air heated by the hardware components is expelled.

In the second embodiment, a cooling system is provided for independent modular systems, for example, for each pair of data center rows of racks having a cold air aisle between them. Each independent cooling module may intake outside air and mix the outside air with inside air for controlling the temperature of the air using a loopback mechanism. In addition, each module may blow air at variable temperatures in a temperature range to maintain the temperature and humidity of the air in the data center. Ingested outside air may also be treated with a cold vapour generator (for example, a sprinkler or water pulverization system) present in each module.

Figure 4A:
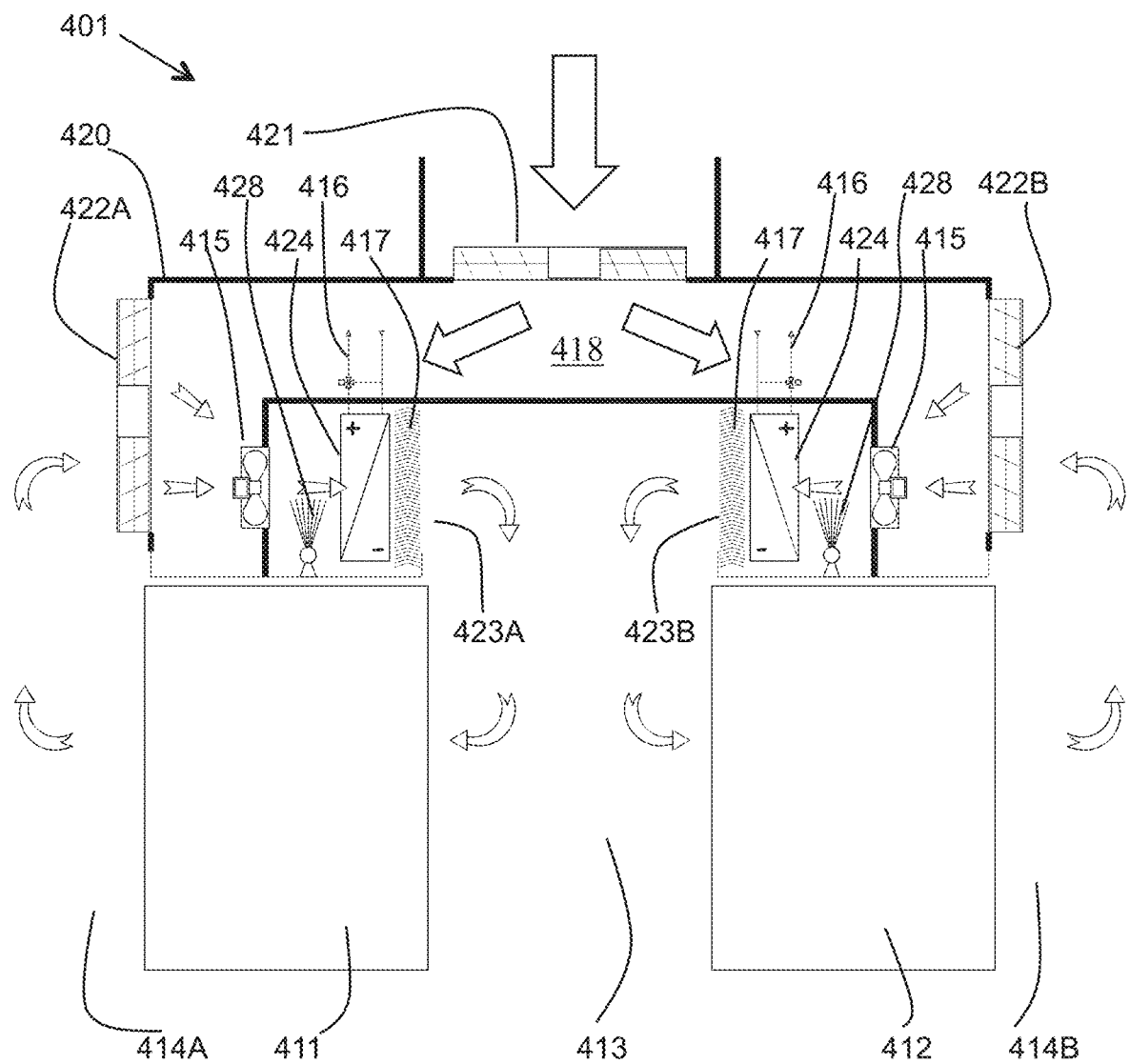
FIGS. 4A to 4C are schematic diagrams of three examples a second embodiment system in accordance with an aspect of the present invention.
Figure 4B:
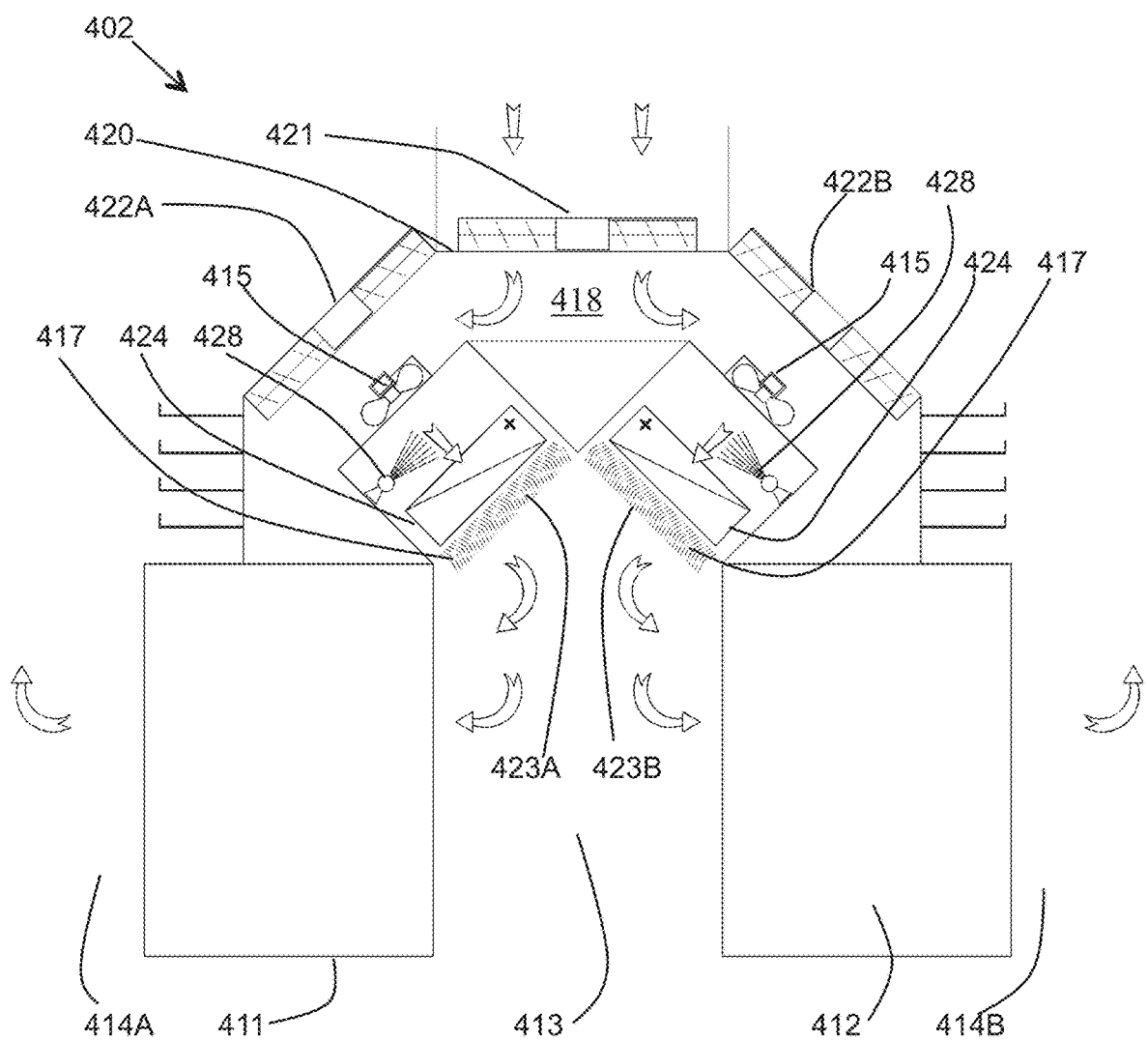
Figure 4C:
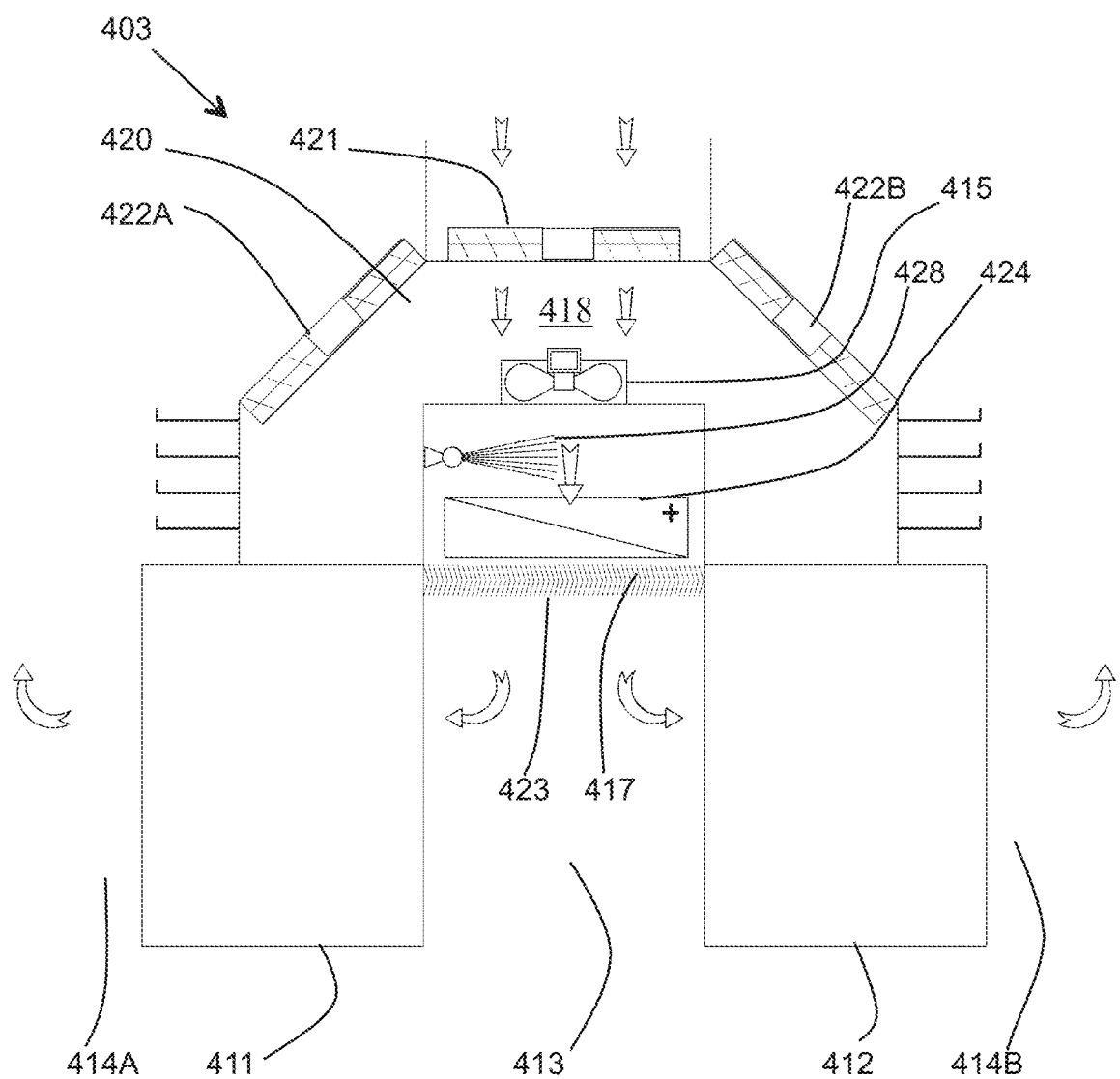

Referring to FIGS. 4A, 4B and 4C, three examples are shown of arrangements 401, 402, 403 of the second embodiment of the described cooling system used in a modular system.

FIGS. 4A, 4B and 4C have common elements as follows. Two racks 411, 412 are shown with a cold aisle 413 between them and hot aisles 414A, 414B on the opposite sides of the racks 411, 412. The modular cooling system 420 is arranged to serve the two racks 411, 412 by providing cooled air to the cold aisle 413 and receiving air for recycling from the hot aisles 414A, 414B.

Each cooling system 420 may include an outside air inlet 421 and two recycled air inlets 422A, 422B. Multiple air outlets 423A, 423B may be provided extending along the racks 411, 412. In this modular system, two recycled air inlets 422A, 422B may be provided which are arranged to receive air from the hot aisles 414A, 414B. The multiple air outlets 423A, 423B may provide cooling air to the cold aisle 413 between the racks 411, 412. Each of the inlets may be in the form of a shutter or register.

Each cooling system 420 includes an internal space 418 through which air flows and is pulled towards the multiple air outlets 423A, 423B by a fan 415 disposed adjacent the air outlet(s).

Each cooling system 420 may an arrangement of components disposed adjacent each air outlet 423A, 423B. The components may include a fan 415, a humidifier 428, a cooling mechanism in the form of a heat exchanger 424 with a chilled air circuit 416, and a drop filter 417 which may be provided in order as the air passes to each air outlet 423, 423A, 423B.

The humidifier 428 may be a sprinkler or water pulverization system which is able to treat 100% of the outside air ingested.

Referring to FIG. 4A, a first arrangement 401 is shown having a central outside air inlet 421 providing air to the internal space 418 inside of the cooling system 420. In this arrangement 401 the internal space 418 is of a generally rectangular cross-section with two recycled air inlets 422A, 422B at either end of the rectangle and with two air outlets 423A, 423B on the inside of perpendicularly extending portions from the rectangle. The two perpendicularly extending portions extend towards and along each of the racks 411, 412 and therefore the two air outlets 423A, 423B may be repeated along the racks 411, 412 to expel air between the racks 411, 412 into the cold aisle 413.

Referring to FIG. 4B, a second arrangement 402 is shown having a central outside air inlet 421 providing air to the internal space 418 inside the cooling system which in this arrangement is formed of two angled areas in cross-section. On each angled area, a recycling inlet 422A, 422B is positioned opposite to an air outlet 423A, 423B. Multiple recycling air inlets 422A, 422B and multiple air outlets 423A, 423B may be arranged extending along the racks 411, 412 to expel air into the cold aisle 413 between the racks 411, 412.

Referring to FIG. 4C, a third arrangement 403 is shown having a central outside air inlet 421 providing air to the internal space 418 inside the cooling system which in this arrangement is formed of two angled areas in cross-section. On each angled area, a recycling air inlet 422A, 422B is positioned. However, in this arrangement, a single air outlet 423 is provided to expel air into the cold aisle 413 between the racks 411, 412. The single air outlet 423 may be repeated along a corridor between the racks 411, 412.

Figure 5B:
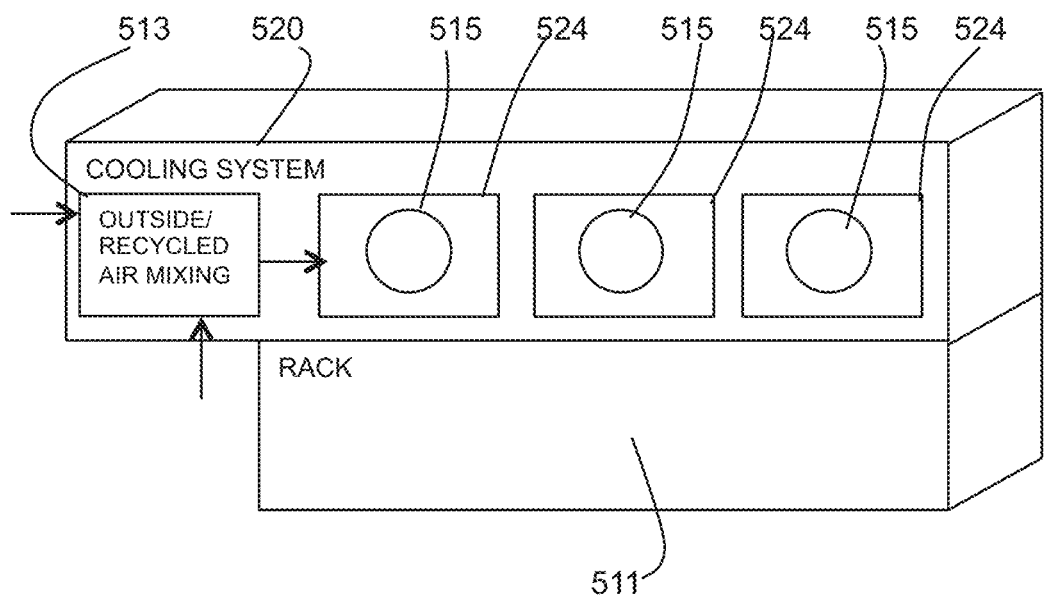
FIGS. 5A, 5B and 5C are schematic diagrams of a plan, perspective side view, and cross-section view of the second embodiment in a modular system in accordance with an aspect of the present invention.
Figure 5C:
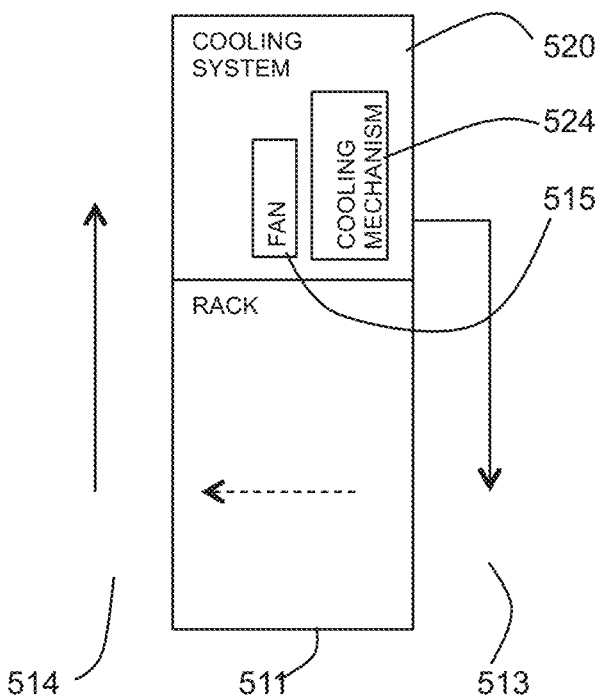
Figure 5D:
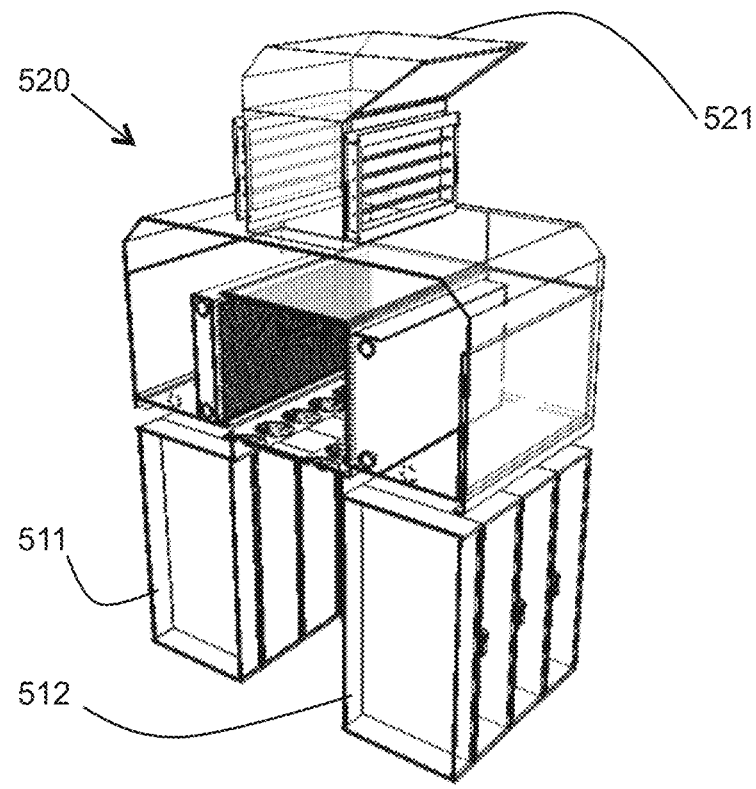
FIGS. 5D and 5F, are perspective views of further embodiments of a modular system in accordance with aspects of the present invention.
Figure 5E:
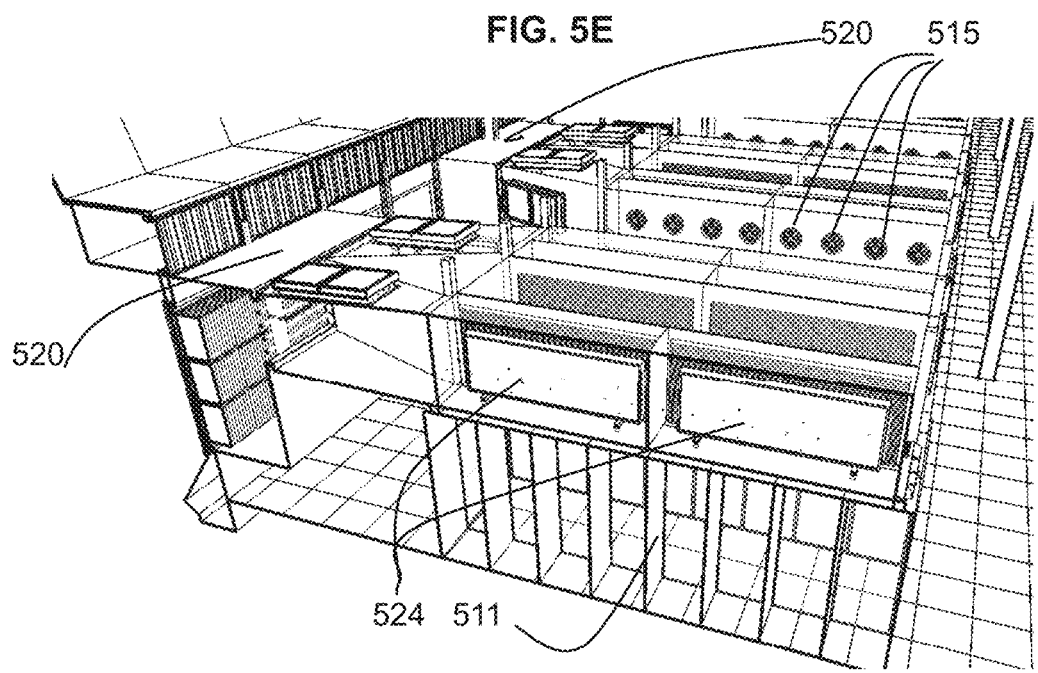

FIGS. 5A, 5B and 5C show schematic diagrams of a plan view, perspective side view, and cross-section view of the modular system of the second embodiment. In addition, FIGS. 5D and 5E are perspective views of the modular system.

Referring to FIG. 5A, multiple cooling systems 520 may be provided in an enclosure 510 with each cooling system 520 serving a pair of racks 511, 512. A cold aisle 513 is between the two racks 511, 512 of a pair served by a cooling system 520 and a hot aisle 514 is between the sets of pairs of racks. Arrows in FIG. 5A show the movement of air into and out of each cooling system 520 and around the racks 511, 512.

Thus in FIG. 5A, the present invention provides an embodiment for a system for cooling heat-generating hardware equipment in the enclosure 510 that comprises a first cooling system (520, left side of FIG. 5A), a second cooling system (520, right side of FIG. 5A), and a remaining portion of the enclosure that is external to both the first cooling system and the second cooling system. The system of FIG. 5A comprises the first cooling system, the second air cooling system, a first pair of racks (511, 512, left side of FIG. 5A) in the remaining portion of the enclosure, and a second pair of racks (511, 512, right side of FIG. 5A) in the remaining portion of the enclosure. The first cooling system and the second air cooling system are each representative of the cooling system 120 of FIG. 1.

The first pair of racks houses heat-generating hardware equipment in each rack of the first pair of racks. The first pair of racks is located with respect to the first cooling system to enable the air that has exited the first cooling system at the outlet of the first cooling system to flow in a first direction 541 in a first aisle 531 between the racks of the first pair of racks to cool the heat-generating equipment in each rack of the first pair of racks.

The second pair of racks house heat-generating hardware equipment in each rack of the second pair of racks. The second pair of racks are located with respect to the second cooling system to enable the air that has exited the second cooling system at the outlet of the second cooling system to flow in the first direction 541 in a second aisle 532 between the racks of the second pair of racks to cool the heat-generating equipment in each rack of the second pair of racks.

The first cooling system and the first pair of racks are separated from the second cooling system and the second pair of racks by a third aisle 513 in which the air that has exited the first aisle and the air that has exited the second aisle flows in a second direction 542 opposite the first direction in the third aisle adjacent to and cools: the first cooling system, only one rack in the first pair of racks, the second cooling system, and only one rack in the second pair of racks.

In one embodiment as depicted in FIG. 5A, the racks in the first and second pair of racks are parallel to one another.

In one embodiment as depicted in FIG. 5A, a first exterior surface 551 of the first cooling system contains the outlet of the first cooling system, wherein each rack of the first pair of racks is in direct physical contact with the first exterior surface of the first cooling system, wherein a second exterior surface 552 of the second cooling system contains the outlet of the second cooling system, and wherein each rack of the second pair of racks is in direct physical contact with the second exterior surface of the second cooling system.

Referring to FIG. 5B, a perspective side view of a modular system seen from the side of a hot aisle of a rack 511. FIG. 5B shows that the cooling system 520 may be provided in elongate form in order to provide multiple fans 515 adjacent multiple cooling mechanisms 524 for providing cooling air along the rack 511 at multiple air outlets (not seen as on the cold aisle side). Outside and recycled air may be mixed 513 as appropriate dependent on the open/closed status of the outside air inlet and recycled air inlet before the mixed air proceeds to the multiple fans 515 and cooling mechanisms 524.

Referring to FIG. 5C, a cross-section view of the modular system is shown through the elongate section of FIG. 5B. The cold aisle 513 receives the output of the cooling system 520 which has passed through a fan 515 and selectively operable cooling mechanism 524. Arrows show the cold air being received in the cold aisle 513 and passing through the rack 511 and being exhausted through the hot aisle 514 from where it may be recycled into a recycled air inlet.

Referring to FIG. 5D, a perspective view is shown of a cooling system 520 mounted above two racks 511, 512 with a duct providing outside air to an outside air inlet 521 to the cooling system 520. In FIG. 5D, the cooling system 520 is in the form of a module covering a group of racks (for example, six racks) with a complete mechanism and shutters.

Referring to FIG. 5E, a perspective view is shown of an alternative embodiment with a series of cooling system 520 provided for racks 511, 512. In this embodiment, each cooling system 520 has a common air mixing unit and extension modules covering multiple racks 511, 512. This figure shows multiple fans 515 and cooling mechanisms 524 above the racks 511, 512 providing multiple air outlets 523 along the racks 511, 512.

Using the modular system additional capacity may be added section by section with no infrastructure modification. Free cooling of air from outside can be provided directly to a cold aisle between data racks. Each module is able to draw outside air and use combinations of the outside air and cooling mechanism cooling as well s recycled air. This may be controlled to control the output air temperature. Loopback control with outside and inside temperature may be used to operate the outside and recycled air inputs.

In the modular system distributed cooling is provided as close as possible to the hot air source. It combines the advantages of having heat exchangers as close a possible to the hardware components for maximum efficiency whilst keeping a common return air path to have similar air return temperatures and a better shared cooling capacity of heat exchangers.

Further advantages of the modular system hide the following:
Direct air free cooling with maximum energy efficiency available for high density data centers;
High density and low density are compatible in the same data center,
Infrastructure investments may be delayed following IT load;
Modularity and reconfiguration may follow IT physical layout evolution;
No more need of a raised floor in a data center which also avoids air flow disturbance due to cables under a raised floor;
Provide for free high and low current cabling distribution;
No need of a specific chilled water temperature
Only main water pipes installed at aisle end as for CRACs system;
Fan speed controlled with cold aisle air pressure;
Variable blowing air temperature to optimize humidifying consumption;
Secondary water circuit valve adapts water temperature to avoid condensation;
Secondary water circuit with variable speed pump controlled with returning temperature.

The method for controlling the temperature and hygrometry of a data center is described in conjunction with the previously described cooling systems. The described method uses three independent control loops. A first is for the control of an outside air inlet, the second is for the control of a cooling mechanism (for example, by controlling a cold water valve for a heat exchanger), and a third for control of a recycled air inlet.

Two temperature measuring points are used, namely an outside air measuring point and a blowing air measuring point at an air outlet of the cooling system.

Additional conditions may be catered for in the form of a maximum water weight in outside air, exceptional conditions such as fire, etc. which may result in an overriding of the control method in order to close an outside air inlet.

The control method may aim to keep the blowing air temperature in a predefined temperature range. For example, the range may be between 13 degrees Celsius and 25 degrees Celsius, although other ranges may be set for the control system such as a narrower range of 15 degrees Celsius to 22 degrees Celsius. A maximum outside air temperature may also be predefined and set for the control method. For example, the maximum outside air temperature may be set at approximately 35 degrees Celsius, or a selected temperature in the range of approximately 30 degrees Celsius to 40 degrees Celsius. If very sensitive hardware components are housed in the data center, the blowing air temperature range and the maximum outside air temperature may be reduced to ensure lower operating temperatures.

A rule may be provided for maximum outside air to stop outside air input (free cooling) when the temperature of the outside air is equal to or above the mean temperature of the air coming out of the hardware components.

The control of the outside air inlet may be based on the outside air temperature monitored at the outside air inlet. The outside air inlet may be kept open until the outside air temperature reaches a high threshold (for example, approximately 35 degrees Celsius), if external contamination is detected (such as fire, sand, wind, gas, etc. if the water weight is greater than approximately 16 g/kgas (corresponding to RH=80% at 25 degrees Celsius). If the outside air inlet is closed, the recycling air inlet may be opened.

The control of the cooling mechanism may be carried out by monitoring the temperature of the blowing air at the air outlet. As the blowing air temperature rises to the maximum of a predefined acceptable range (for example, 13 degrees Celsius to 25 degrees Celsius), the cooling mechanism may be selectively activated in addition to the free cooling of the outside air inlet.

The control of the recycling air inlet may be based on monitoring the temperature of the blowing air at the air outlet and on monitoring the outside air temperature at the outside air inlet. The recycling air inlet may be gradually closed from an open position as the temperature outside air temperature rises from very cold to the minimum of the blowing air temperature range. The recycling air inlet may be opened fully in response to the closing of the outside air inlet at a high temperature.

Figure 6:
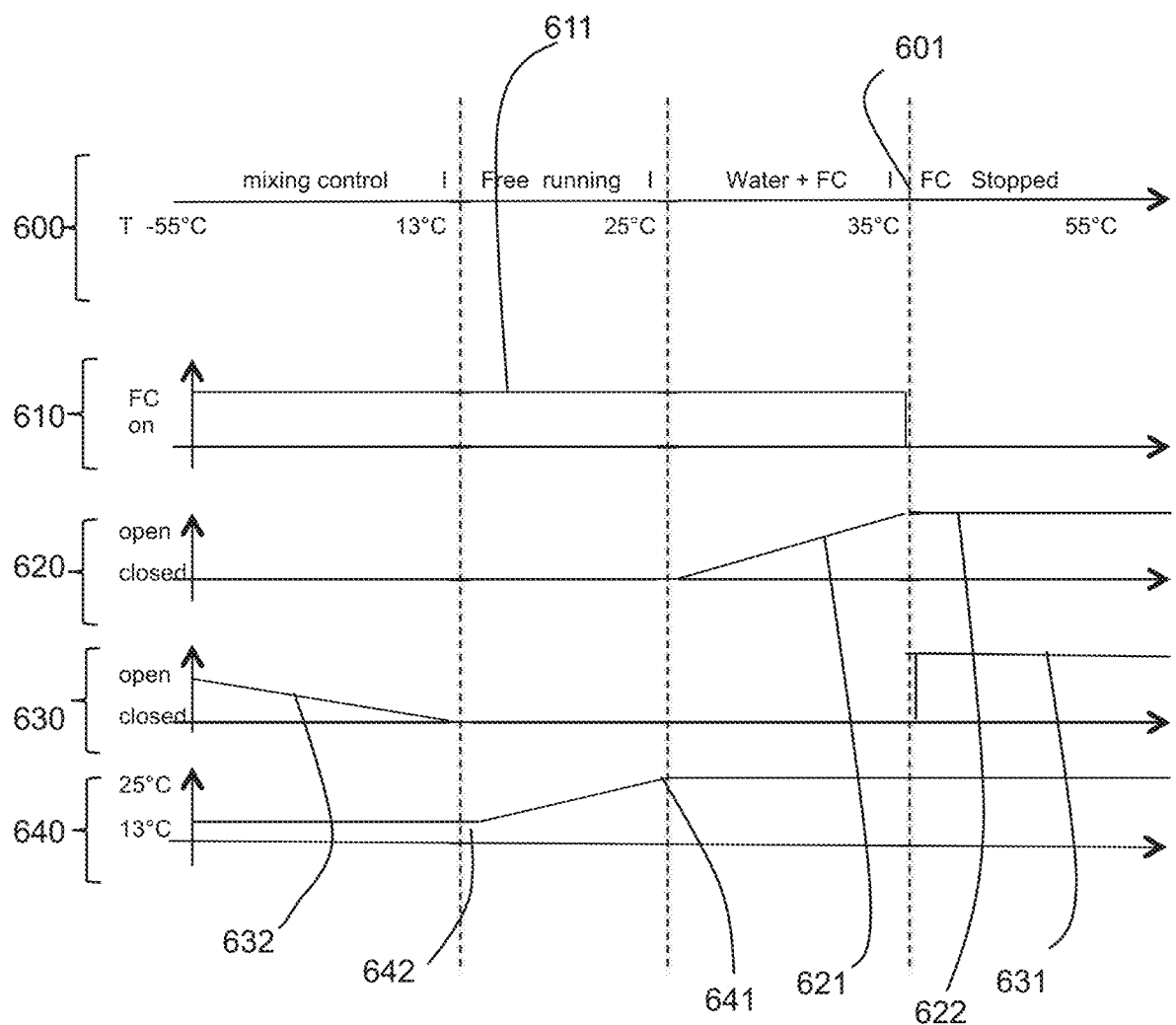
FIG. 6 is a schematic graph showing a temperature range and cooling control in accordance with an aspect of the present invention.

Referring to FIG. 6, a schematic diagram is shown of the outside air temperature 600 against graphs of the operation of the outside air inlet 610, the cooling mechanism 620, and the recycling air inlet 630, and the variation of the blowing air temperature 640.

Moving from low temperature on the left of the diagram to high temperature on the right the control method operates the three independent controls of the outside air inlet 610, the cooling mechanism 620 and the recycled air inlet 630.

The outside air inlet graph 610 shows that the outside air inlet is keep open 611 to enable free cooling until a maximum outside air temperature 601 is detected at which point the outside air inlet is closed. When the outside air inlet is closed, the recycled air inlet is opened 631 to allow air flow through the cooling system.

The cooling mechanism graph 620 shows that the cooling mechanism is gradually activated 621 when the blowing air temperature is monitored at the top of the desired temperature range 641. When the maximum outside air temperature 601 is monitored the cooling mechanism may be operated fully 622.

The recycled air inlet graph 630 shows that the recycled air inlet is initially open 632 at cold temperatures and gradually closed as the blowing air temperature reaches the minimum 642 of the desired temperature range. Thereafter, the air inlet may stay closed unless the maximum outside air temperature 601 is monitored or any other exceptional circumstance occurs and the outside air inlet is closed, in which case, the recycled air inlet is opened.

Thus in FIG. 6, the present invention provides an embodiment for a method for cooling air within an enclosure, wherein a specified first temperature (e.g., 13° C.) is less than a specified second temperature (e.g., 25° C.) and the specified second temperature is less than a specified third temperature (e.g., 35° C.). The enclosure comprises a cooling system and a remaining portion of the enclosure that is external to the cooling system, wherein the cooling system comprises a cooling mechanism for cooling air in the cooling system, a first inlet (e.g., outside air inlet 121 of FIG. 1; 610 of FIG. 6) through which air outside the enclosure enters the cooling system, a second inlet (e.g., recycled air inlet 122 of FIG. 1; 630 of FIG. 6) through which recycled air flows from the remaining portion of the enclosure into the cooling system, and an outlet (e.g., air outlet 123 of FIG. 1) through which air flows from the cooling system into the remaining portion of the enclosure. An outside air temperature (600, FIG. 6) of air entering the cooling system from outside the enclosure is monitored (step 702 of FIG. 7). A blowing air temperature (640, FIG. 6) of air in the cooling system at the outlet of the cooling system is monitored (step 801 of FIG. 8).

The first inlet is controlled to be fully open or fully closed (610, FIG. 6), in dependence on the monitored outside air temperature (600, FIG. 6), to control whether air from outside the enclosure enters or does not enter, respectively, the cooling system. As shown in the profile of 610 of FIG. 6, controlling the first inlet comprises either (i) determining that the monitored outside air temperature (600, FIG. 6) is less than or equal to the third temperature (35° C. in FIG. 6) and in response controlling the first inlet to be fully open or (ii) determining that the monitored outside air temperature (600, FIG. 6) is greater than the third temperature (35° C. in FIG. 6) and in response controlling the first inlet to be fully closed.

The second inlet is controlled by adjusting an amount of opening of the second inlet (630, FIG. 6), in dependence on the monitored blowing air temperature (640, FIG. 6), to control a flow rate of recycled air entering the cooling system from the remaining portion of the enclosure. As shown in the profile of 630 of FIG. 6, controlling the second inlet comprises (i) determining that the monitored blowing air temperature (640, FIG. 6) is less than the first temperature (13° C. in FIG. 6) and in response controlling the second inlet to be partially open in accordance with the depicted monotonically decreasing function of temperature, (ii) determining that the monitored blowing air temperature (640, FIG. 6) is equal to or greater than the first temperature (13° C. in FIG. 6) and less than or equal to the third temperature (35° C. in FIG. 6) and in response controlling the second inlet to be fully closed, or (iii) determining that the monitored blowing air temperature (640, FIG. 6) is greater than the third temperature (35° C. in FIG. 6) and in response controlling the second inlet to be fully open.

A valve in a secondary water circuit of the cooling mechanism is controlled by adjusting an amount of opening of the valve (620, FIG. 6), in dependence on the monitored outside air temperature (600, FIG. 6). As shown in the profile of 620 of FIG. 6, controlling the valve comprises (i) determining that the monitored outside air temperature (600, FIG. 6) is less than or equal to the second temperature (25° C. in FIG. 6) and in response controlling the valve to be fully closed, or (ii) determining that the monitored outside air temperature (600, FIG. 6) is greater than the second temperature (25° C. in FIG. 6) and less than or equal to the third temperature (35° C. in FIG. 6) and in response controlling the valve to be partially open in accordance with the depicted monotonically increasing function of temperature, or (iii) determining that the monitored outside air temperature (600, FIG. is greater than the third temperature (35° C. in FIG. 6) and in response controlling the valve to be fully open.

In one embodiment, controlling the first inlet, controlling the second inlet, and controlling the valve are performed simultaneously.

FIG. 6 additionally shows that: (i) if the outside air temperature (600, FIG. 6) is less than or equal to the first temperature (13° C. in FIG. 6) then the blowing air temperature (640, FIG. 6) is at the first temperature (13° C. in FIG. 6); (ii) if the outside air temperature (600, FIG. 6) is greater than the first temperature (13° C. in FIG. 6) and less than or equal to the second temperature (25° C. in FIG. 6) then the blowing air temperature (640, FIG. 6) is at a temperature that monotonically increases from the first temperature (13° C. in FIG. 6) to the second temperature (25° C. in FIG. 6) as the outside air temperature (600, FIG. 6) increases from the first temperature (13° C. in FIG. 6) to the second temperature (25° C. in FIG. 6); and (iii) if the outside air temperature (600, FIG. 6) is greater than the third temperature (35° C. in FIG. 6) then the blowing air temperature (640, FIG. 6) is at the third temperature (35° C. in FIG. 6).

These three controls result in four operation states which were described and illustrated in relation to FIGS. 2A to 2D, namely mixing control, free running, free cooling plus water, and free cooling stopped.

Figure 7:
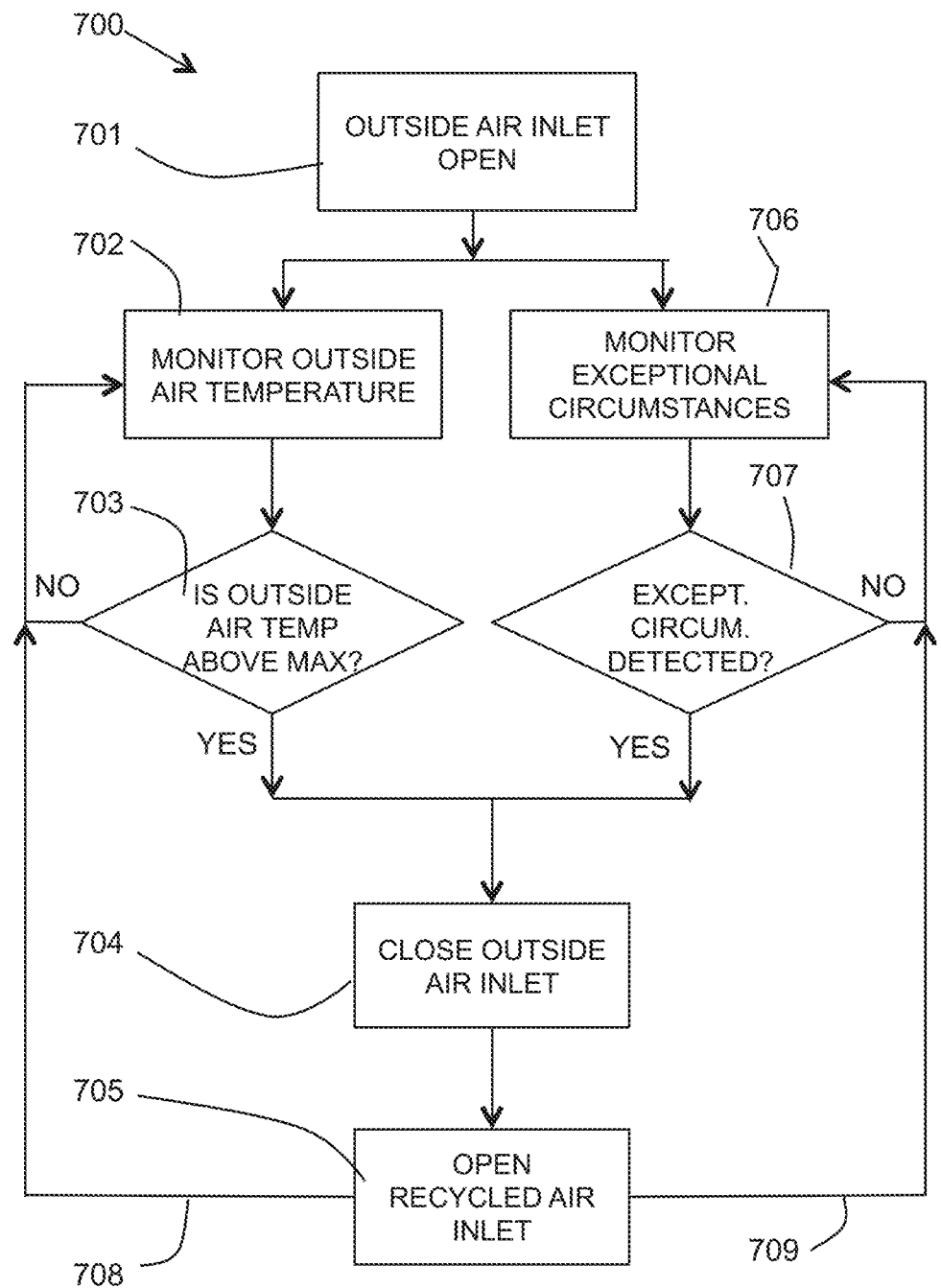
FIG. 7 is a flow diagram of a method in accordance with an aspect of the present invention.

Referring to FIG. 7, a flow diagram 700 shows a first control method for the outside air inlet based on the outside air temperature.

The outside air inlet may be provided in a default open position 701. The outside air temperature is monitored 702 and it is determined if the outside air temperature rises above a predetermined maximum temperature 703. If it is not above the maximum temperature, the monitoring of the outside air temperature 702 continues. If it is above the maximum temperature, the outside air inlet is closed 704 and the recycled air inlet is opened 705.

Exceptional circumstances are also monitored 706 at the outside air. For example, this may include pollutants in the air such as dust, gas, or very high humidity. It is determined 707 if the exceptional circumstances are detected. If they are not detected, then the monitoring 706 continues. If an exceptional circumstance is detected, the outside air inlet is closed 704 and the recycled air inlet is opened 705.

The method loops 708, 709 to continue monitoring the outside air temperature 702 and the exceptional circumstances 706.

Figure 8:
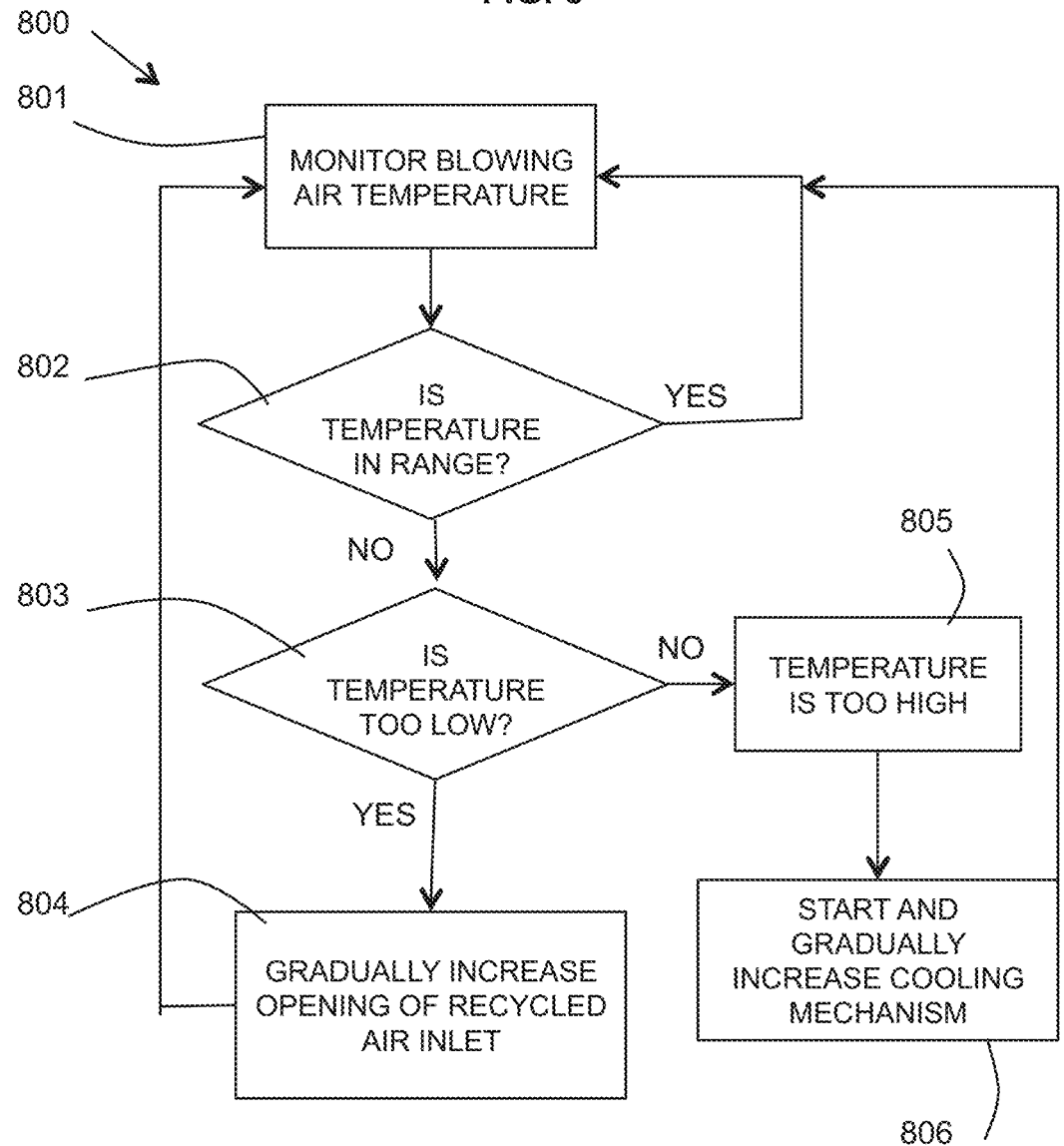
FIG. 8 is a flow diagram of a method in accordance with an aspect of the present invention.

Referring to FIG. 8, a flow diagram 800 shows a second control method for the recycled air inlet and cooling mechanism based on the blowing air temperature.

The blowing air temperature at the air outlet from the cooling system is monitored 801. It is determined if the blowing air temperature is within a predefined range 802. If it is in the range the monitoring 801 continues.

If the temperature is too low 803, the opening of the recycled air inlet may be gradually opened 804. This recycles warm air and therefore increases the blowing air temperature. The method loops to continue monitoring 801 the blowing air temperature.

If the temperature is too high 805, the cooling mechanism is started and gradually increased 806 to bring down the blowing air temperature. The method loops to continue monitoring 801 the blowing air temperature.

A hygrometry monitor at the outside air inlet may control outside air to determine if the weight of water is too high to ensure a maximum, for example 80% relative hygrometry, at blowing temperature. The weight of water limit may vary because the blowing temperature varies when outside air is between a range, for example 13 degrees Celsius to 25 degrees Celsius. A second hygrometry monitor is provided at the air outlet to monitor the air blown from the cooling system to control the cold vapour generator to ensure a minimum of, for example 20% of relative hygrometry at blowing temperature.

Figure 9:
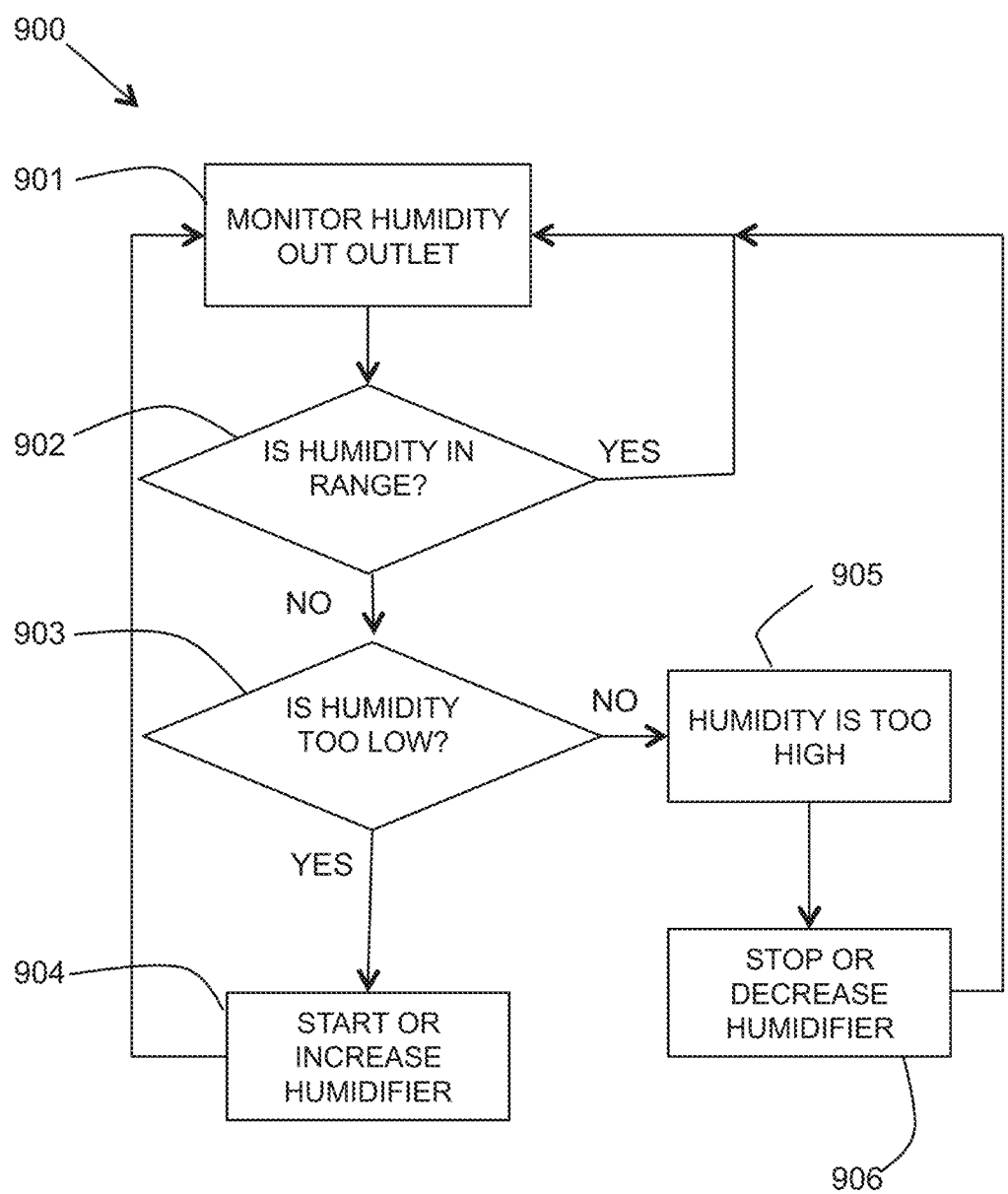
FIG. 9 is a flow diagram of a method in accordance with an aspect of the present invention.

Referring to FIG. 9, a flow diagram 900 shows a control method for the humidity in the cooling system. The humidity may be monitored 901 at the air outlet of the cooling system. It may be determined if the humidity is in an acceptable range 902. If it is in range, the monitoring 901 continues.

If the humidity is too low 903, the humidifier may be started or increased 904. If the humidity is too high 905, the humidifier may be decreased or stopped 906.

Free cooling with outside air has limitations in that a relative hygrometry of 20% to 80% at the blowing air temperature must be respected. Extending blowing air temperature range limits vapour production. Cold vapour production is the only cost effective solution. Hot and humid conditions require free cooling to be limited or stopped. These requirements are respected by the described control method.

Figure 10:
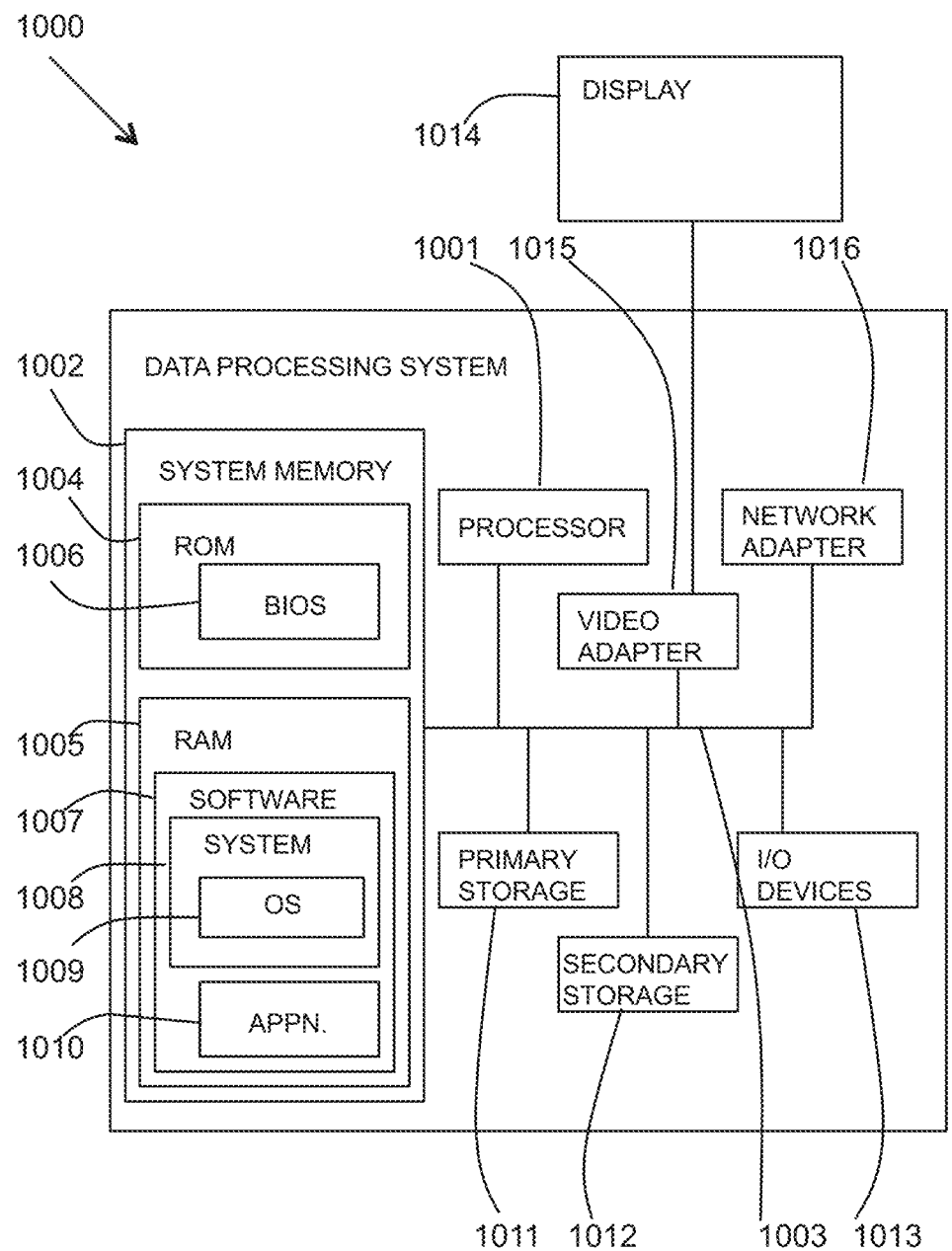
FIG. 10 is a block diagram of an embodiment of a computer system in which the present invention may be implemented.

Referring to FIG. 10, an exemplary system for implementing aspects of the invention includes a data processing system 1000 suitable for storing and/or executing program code including at least one processor 1001 coupled directly or indirectly to memory elements through a bus system 1003. The memory elements may include local memory employed during actual execution of the program code, bulk storage, and cache memories which provide temporary storage of at least some program code in order to reduce the number of times code must be retrieved from bulk storage during execution.

The memory elements may include system memory 1002 in the form of read only memory (ROM) 1004 and random access memory (RAM) 1005. A basic input/output system (BIOS) 1006 may be stored in ROM 1004. System software 1007 may be stored in RAM 1005 including operating system software 1008. Software applications 1010 may also be stored in RAM 1005.

The system 1000 may also include a primary storage means 1011 such as a magnetic hard disk drive and secondary storage means 1012 such as a magnetic disc drive and an optical disc drive. The drives and their associated computer-readable media provide non-volatile storage of computer-executable instructions, data structures, program modules and other data for the system 1000. Software applications may be stored on the primary and secondary storage means 1011, 1012 as well as the system memory 1002.

The computing system 1000 may operate in a networked environment using logical connections to one or more remote computers via a network adapter 1016.

Input/output devices 1013 may be coupled to the system either directly or through intervening I/O controllers. A user may enter commands and information into the system 1000 through input devices such as a keyboard, pointing device, or other input devices (for example, microphone, joy stick, game pad, satellite dish, scanner, or the like). Output devices may include speakers, printers, etc. A display device 1014 is also connected to system bus 1003 via an interface, such as video adapter 1015.

The control system can take the form of an entirely hardware embodiment, an entirely software embodiment or an embodiment containing both hardware and software elements. In a preferred embodiment, the control system ay be implemented in software, which includes but is not limited to firmware, resident software, microcode, etc.

Thus, the data processing system 1000 comprises the at least one processor 1001, the memory (RAM 1005 or ROM 1004) coupled to the at least one processor, and at least one computer readable hardware storage device (1011, 1012) coupled to the at least one processor, wherein the at least one storage device contains program code which, upon being executed by the at least one processor via the memory, implements the methods of the present invention.

The control system may take the form of a computer program product accessible from a computer-usable or computer-readable medium providing program code for use by or in connection with a computer or any instruction execution system. For the purposes of this description, a computer usable or computer readable medium can be any apparatus that can contain, store, communicate, propagate, or transport the program for use by or in connection with the instruction execution system, apparatus or device.

Thus a computer program product of the present invention comprises at least one computer hardware readable storage device (1011, 1012) containing program code which, upon being executed by least one processor 1001 of the data processing system 1000, implements the methods of the present invention.

The medium and each hardware readable storage device can be an electronic, magnetic, optical, electromagnetic, or semiconductor system (or apparatus or device). Examples of a computer-readable medium and hardware readable storage devices include a semiconductor or solid state memory, magnetic tape, a removable computer diskette, a random access memory (RAM), a read only memory (ROM), a rigid magnetic disk and an optical disk. Current examples of optical disks include compact disk read only memory (CD-ROM), compact disk read/write (CD-R/W), and DVD.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer maybe connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Improvements and modifications can be made to the foregoing without departing from the scope of the present invention.

What is claimed is:

1. A method for cooling air within an enclosure, wherein the enclosure comprises a cooling system and a remaining portion of the enclosure that is external to the cooling system, wherein the cooling system comprises a cooling mechanism for cooling air in the cooling system, a first inlet through which air outside the enclosure enters the cooling system, a second inlet through which recycled air flows from the remaining portion of the enclosure into the cooling system, and an outlet through which air flows from the cooling system into the remaining portion of the enclosure, wherein the first inlet, the second inlet, and the outlet are different openings, in an exterior bounding surface of the cooling system, for air flow and are physically separated from one another, said method comprising:

monitoring, by one or more processors of a data processing system, an outside air temperature of air entering the cooling system from outside the enclosure;

monitoring, by the one or more processors, a blowing air temperature of air in the cooling system at the outlet of the cooling system; and controlling, by the one or more processors, the first inlet to be fully open or fully closed, in dependence on the monitored outside air temperature, to control whether air from outside the enclosure enters or does not enter, respectively, the cooling system;

controlling, by the one or more processors, the second inlet by adjusting an amount of opening of the second inlet, in dependence on the monitored blowing air temperature, to control a flow rate of recycled air entering the cooling system from the remaining portion of the enclosure; and controlling, by the one or more processors, a valve in a secondary water circuit of the cooling mechanism by adjusting an amount of opening of the valve, in dependence on the monitored outside air temperature.

2. The method of claim 1, wherein a specified first temperature is less than a specified second temperature and the specified second temperature is less than a specified third temperature;

wherein said controlling the first inlet comprises either (i) determining that the monitored outside air temperature is less than or equal to the third temperature and in response controlling the first inlet to be fully open or (ii) determining that the monitored outside air temperature is greater than the third temperature and in response controlling the first inlet to be fully closed;

wherein said controlling the second inlet comprises (i) determining that the monitored blowing air temperature is less than the first temperature and in response controlling the second inlet to be partially open, (ii) determining that the monitored blowing air temperature is equal to or greater than the first temperature and less than or equal to the third temperature and in response controlling the second inlet to be fully closed, or (iii) determining that the monitored blowing air temperature is greater than the third temperature and in response controlling the second inlet to be fully open; and wherein said controlling the valve comprises (i) determining that the monitored outside air temperature is less than or equal to the second temperature and in response controlling the valve to be fully closed, or (ii) determining that the monitored outside air temperature is greater than the second temperature and less than or equal to the third temperature and in response controlling the valve to be partially open, or (iii) determining that the monitored outside air temperature is greater than the third temperature and in response controlling the valve to be fully open.

3. The method of claim 2, wherein said controlling the second inlet comprises:

determining that the monitored blowing air temperature is less than the first temperature, and in response (i) determining the amount of opening of the second inlet from a specified monotonically decreasing function of temperature in a temperature range from the first temperature to the second temperature and (ii) controlling the second inlet to be partially open in accordance with the determined amount of opening of the second inlet.

4. The method of claim 2, wherein said controlling the valve comprises:

determining that the monitored outside air temperature is greater than the second temperature and less than or equal to the third temperature and in response (i) determining the amount of opening of the valve from a specified monotonically increasing function of temperature in a temperature range from the second temperature to the third temperature and (ii) controlling the valve to be partially open in accordance with the determined amount of opening of the valve.

5. The method of claim 1, wherein said controlling the first inlet, said controlling the second inlet, and said controlling the valve are performed simultaneously.

6. The method of claim 1, said method further comprising:
monitoring, by the one or more processors, a humidity of the air that has exited the cooling system at the outlet; and
controlling, by the one or more processors, operation of a humidifier in the cooling system to control a humidity of air in the cooling system in dependence on the monitored humidity of the air that has exited the cooling system at the outlet.

7. A data processing system comprising one or more processors, a memory coupled to the one or more processors, and at least one computer readable hardware storage device coupled to the one or more processors, said at least one storage device containing program code which, upon being executed by the one or more processors via the memory, implements a method for cooling air within an enclosure, wherein the enclosure comprises a cooling system and a remaining portion of the enclosure that is external to the cooling system, wherein the cooling system comprises a cooling mechanism for cooling air in the cooling system, a first inlet through which air outside the enclosure enters the cooling system, a second inlet through which recycled air flows from the remaining portion of the enclosure into the cooling system, and an outlet through which air flows from the cooling system into the remaining portion of the enclosure, wherein the first inlet, the second inlet, and the outlet are different openings, in an exterior bounding surface of the cooling system, for air flow and are physically separated from one another, said method comprising:
monitoring, by the one or more processors, an outside air temperature of air entering the cooling system from outside the enclosure;
monitoring, by the one or more processors, a blowing air temperature of air in the cooling system at the outlet of the cooling system; and
controlling, by the one or more processors, the first inlet to be fully open or fully closed, in dependence on the monitored outside air temperature, to control whether air from outside the enclosure enters or does not enter, respectively, the cooling system;
controlling, by the one or more processors, the second inlet by adjusting an amount of opening of the second inlet, in dependence on the monitored blowing air temperature, to control a flow rate of recycled air entering the cooling system from the remaining portion of the enclosure; and
controlling, by the one or more processors, a valve in a secondary water circuit of the cooling mechanism by adjusting an amount of opening of the valve, in dependence on the monitored outside air temperature.

8. The data processing system of claim 7,
wherein a specified first temperature is less than a specified second temperature and the specified second temperature is less than a specified third temperature;
wherein said controlling the first inlet comprises either (i) determining that the monitored outside air temperature is less than or equal to the third temperature and in response controlling the first inlet to be fully open or (ii) determining that the monitored outside air temperature is greater than the third temperature and in response controlling the first inlet to be fully closed;
wherein said controlling the second inlet comprises (i) determining that the monitored blowing air temperature is less than the first temperature and in response controlling the second inlet to be partially open, (ii) determining that the monitored blowing air temperature is equal to or greater than the first temperature and less than or equal to the third temperature and in response controlling the second inlet to be fully closed, or (iii) determining that the monitored blowing air temperature is greater than the third temperature and in response controlling the second inlet to be fully open; and
wherein said controlling the valve comprises (i) determining that the monitored outside air temperature is less than or equal to the second temperature and in response controlling the valve to be fully closed, or (ii) determining that the monitored outside air temperature is greater than the second temperature and less than or equal to the third temperature and in response controlling the valve to be partially open, or (iii) determining that the monitored outside air temperature is greater than the third temperature and in response controlling the valve to be fully open.

9. The data processing system of claim 8, wherein said controlling the second inlet comprises:
determining that the monitored blowing air temperature is less than the first temperature, and in response (i) determining the amount of opening of the second inlet from a specified monotonically decreasing function of temperature in a temperature range from the first temperature to the second temperature and (ii) controlling the second inlet to be partially open in accordance with the determined amount of opening of the second inlet.

10. The data processing system of claim 8, wherein said controlling the valve comprises:
determining that the monitored outside air temperature is greater than the second temperature and less than or equal to the third temperature and in response (i) determining the amount of opening of the valve from a specified monotonically increasing function of temperature in a temperature range from the second temperature to the third temperature and (ii) controlling the valve to be partially open in accordance with the determined amount of opening of the valve.

11. The data processing system of claim 7, wherein said controlling the first inlet, said controlling the second inlet, and said controlling the valve are performed simultaneously.

12. The data processing system of claim 7, said method further comprising:
monitoring, by the one or more processors, a humidity of the air that has exited the cooling system at the outlet; and
controlling, by the one or more processors, operation of a humidifier in the cooling system to control a humidity of air in the cooling system in dependence on the monitored humidity of the air that has exited the cooling system at the outlet.

13. A computer program product, comprising at least one computer hardware readable storage device containing program code which, upon being executed by one or more processors of a data processing system, implement a method for cooling air within an enclosure, wherein the enclosure comprises a cooling system and a remaining portion of the enclosure that is external to the cooling system, wherein the cooling system comprises a cooling mechanism for cooling air in the cooling system, a first inlet through which air outside the enclosure enters the cooling system, a second inlet through which recycled air flows from the remaining portion of the enclosure into the cooling system, and an outlet through which air flows from the cooling system into the remaining portion of the enclosure, wherein the first inlet, the second inlet, and the outlet are different openings, in an exterior bounding surface of the cooling system, for air flow and are physically separated from one another, said method comprising:

monitoring, by the one or more processors, an outside air temperature of air entering the cooling system from outside the enclosure;

monitoring, by the one or more processors, a blowing air temperature of air in the cooling system at the outlet of the cooling system; and controlling, by the one or more processors, the first inlet to be fully open or fully closed, in dependence on the monitored outside air temperature, to control whether air from outside the enclosure enters or does not enter, respectively, the cooling system;

controlling, by the one or more processors, the second inlet by adjusting an amount of opening of the second inlet, in dependence on the monitored blowing air temperature, to control a flow rate of recycled air entering the cooling system from the remaining portion of the enclosure; and controlling, by the one or more processors, a valve in a secondary water circuit of the cooling mechanism by adjusting an amount of opening of the valve, in dependence on the monitored outside air temperature.

14. The computer program product of claim 13,
wherein a specified first temperature is less than a specified second temperature and the specified second temperature is less than a specified third temperature;
wherein said controlling the first inlet comprises either (i) determining that the monitored outside air temperature is less than or equal to the third temperature and in response controlling the first inlet to be fully open or (ii) determining that the monitored outside air temperature is greater than the third temperature and in response controlling the first inlet to be fully closed;
wherein said controlling the second inlet comprises (i) determining that the monitored blowing air temperature is less than the first temperature and in response controlling the second inlet to be partially open, (ii) determining that the monitored blowing air temperature is equal to or greater than the first temperature and less than or equal to the third temperature and in response controlling the second inlet to be fully closed, or (iii) determining that the monitored blowing air temperature is greater than the third temperature and in response controlling the second inlet to be fully open; and
wherein said controlling the valve comprises (i) determining that the monitored outside air temperature is less than or equal to the second temperature and in response controlling the valve to be fully closed, or (ii) determining that the monitored outside air temperature is greater than the second temperature and less than or equal to the third temperature and in response controlling the valve to be partially open, or (iii) determining that the monitored outside air temperature is greater than the third temperature and in response controlling the valve to be fully open.

15. The computer program product of claim 14, wherein said controlling the second inlet comprises:
determining that the monitored blowing air temperature is less than the first temperature, and in response (i) determining the amount of opening of the second inlet from a specified monotonically decreasing function of temperature in a temperature range from the first temperature to the second temperature and (ii) controlling the second inlet to be partially open in accordance with the determined amount of opening of the second inlet.

16. The computer program product of claim 14, wherein said controlling the valve comprises:
determining that the monitored outside air temperature is greater than the second temperature and less than or equal to the third temperature and in response (i) determining the amount of opening of the valve from a specified monotonically increasing function of temperature in a temperature range from the second temperature to the third temperature and (ii) controlling the valve to be partially open in accordance with the determined amount of opening of the valve.

17. The computer program product of claim 13, wherein said controlling the first inlet, said controlling the second inlet, and said controlling the valve are performed simultaneously.

18. The computer program product of claim 13, said method further comprising:
monitoring, by the one or more processors, a humidity of the air that has exited the cooling system at the outlet; and
controlling, by the one or more processors, operation of a humidifier in the cooling system to control a humidity of air in the cooling system in dependence on the monitored humidity of the air that has exited the cooling system at the outlet.

* * * * *